(12) United States Patent
Matsumoto

(10) Patent No.: US 7,253,885 B2
(45) Date of Patent: Aug. 7, 2007

(54) WAVELENGTH SELECTING METHOD, POSITION DETECTING METHOD AND APPARATUS, EXPOSURE METHOD AND APPARATUS, AND DEVICE MANUFACTURING METHOD

(75) Inventor: Takahiro Matsumoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 169 days.

(21) Appl. No.: 11/002,906

(22) Filed: Dec. 3, 2004

(65) Prior Publication Data

US 2005/0128452 A1 Jun. 16, 2005

(30) Foreign Application Priority Data

Dec. 5, 2003 (JP) ............................. 2003-407504
Apr. 6, 2004 (JP) ............................. 2004-112535

(51) Int. Cl.
*G03B 27/32* (2006.01)
*G03B 27/42* (2006.01)

(52) U.S. Cl. .......................................... 355/77; 355/67
(58) Field of Classification Search ................. 355/53, 355/67, 77; 356/400, 401
See application file for complete search history.

(56) References Cited

U.S. PATENT DOCUMENTS

| | | | |
|---|---|---|---|
| 4,355,892 A * | 10/1982 | Mayer et al. ................. 355/77 |
| 5,369,486 A | 11/1994 | Matsumoto et al. ........ 356/349 |
| 5,432,603 A | 7/1995 | Sentoku et al. ............. 356/349 |
| 5,448,332 A | 9/1995 | Sakakibara et al. ........... 355/53 |
| 5,559,598 A | 9/1996 | Matsumoto ................. 356/356 |
| 5,585,923 A | 12/1996 | Nose et al. ................. 356/363 |
| 5,610,718 A | 3/1997 | Sentoku et al. ............. 356/363 |
| 5,625,453 A | 4/1997 | Matsumoto et al. ........ 356/351 |
| 5,682,239 A | 10/1997 | Matsumoto et al. ........ 356/349 |
| 5,693,439 A | 12/1997 | Tanaka et al. ................ 430/30 |
| 5,703,685 A | 12/1997 | Senda et al. ................ 356/401 |
| 5,751,426 A | 5/1998 | Nose et al. ................. 356/356 |
| 6,151,120 A | 11/2000 | Matsumoto et al. ........ 356/399 |
| 6,285,033 B1 | 9/2001 | Matsumoto ................. 250/548 |
| 6,421,124 B1 | 7/2002 | Matsumoto et al. ........ 356/401 |
| 6,433,872 B1 | 8/2002 | Nishi et al. ................. 356/400 |
| 6,559,924 B2 | 5/2003 | Ina et al. ...................... 355/53 |
| 6,608,681 B2 | 8/2003 | Tanaka et al. ............. 356/400 |
| 6,649,923 B2 | 11/2003 | Matsumoto ................. 250/548 |
| 6,869,739 B1 * | 3/2005 | Ausschnitt et al. ........... 430/30 |

(Continued)

FOREIGN PATENT DOCUMENTS

JP 6-260390 9/1994

(Continued)

*Primary Examiner*—Diane Lee
*Assistant Examiner*—Marissa A. Ohira
(74) *Attorney, Agent, or Firm*—Fitzpatrick, Cella, Harper & Scinto

(57) ABSTRACT

A wavelength selecting method for selecting a wavelength of light, the light being used to detect a position of a target with a signal from an image of an alignment mark covered with resist, includes the steps of obtaining a reflectance of the resist at a position outside the alignment mark by irradiating lights having plural wavelengths to the resist at the position, and selecting one of the lights which one has a wavelength that provides the maximum value of ∗ reflectance among the reflectances measured by the measuring step or which one has a wavelength that falls within a predetermined wave range centering on the wavelength that provide the maximum reflectance.

4 Claims, 48 Drawing Sheets

U.S. PATENT DOCUMENTS

2002/0076628 A1* 6/2002 Hanawa ........................ 430/30
2002/0176082 A1 11/2002 Sakakibara et al. ......... 356/400
2003/0045116 A1* 3/2003 Wang et al. ................. 438/710
2003/0223050 A1* 12/2003 Fritze et al. .................. 355/51
2004/0059540 A1 3/2004 Matsumoto et al. ........ 702/150

FOREIGN PATENT DOCUMENTS

JP          6-260391          9/1994

* cited by examiner

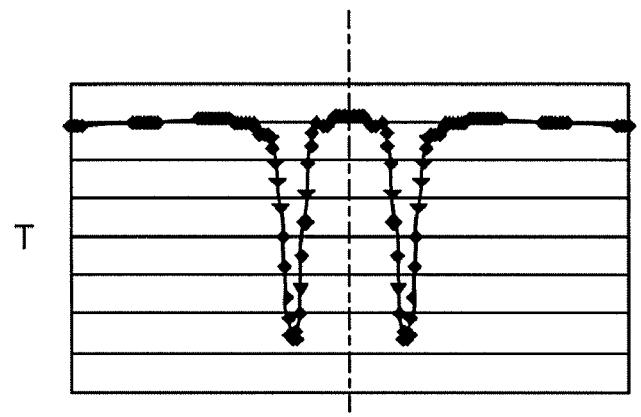
FIG. 8A  T
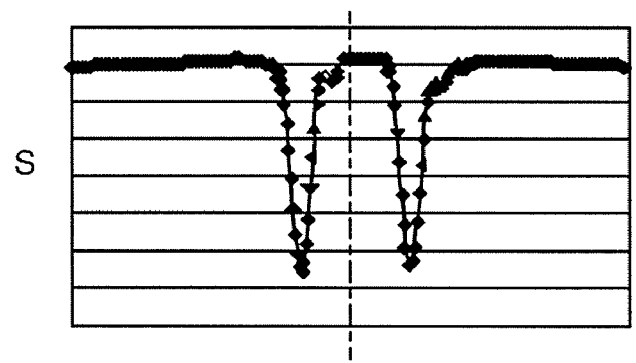
FIG. 8B  S
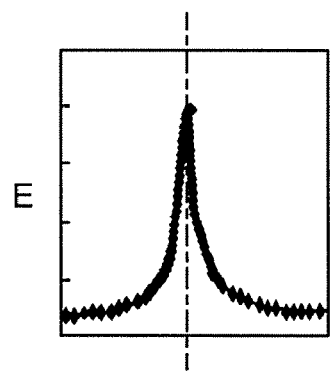
FIG. 8C  E

WAVELENGTH SELECTING METHOD, POSITION DETECTING METHOD AND APPARATUS, EXPOSURE METHOD AND APPARATUS, AND DEVICE MANUFACTURING METHOD

BACKGROUND OF THE INVENTION

The present invention relates generally to position detecting apparatus and method, and more particularly to position detecting apparatus and method for detecting a position of an object, such as a wafer, in an exposure apparatus that manufactures various devices including semiconductor chips such as ICs and LSIs, CCDs, and magnetic heads. The present invention is suitable, for example, for an alignment between a reticle and a wafer.

Recent demands for smaller and thinner electronic apparatuses have increasingly required finer processing to semiconductor devices mounted on these electronic apparatuses. A reduction projection exposure apparatus has been conventionally employed which uses a projection optical system to project a circuit pattern formed on a mask (or a reticle) onto a wafer, etc. to transfer the circuit pattern, in photolithography technology for manufacturing the semiconductor device.

The minimum critical dimension ("CD") to be transferred by the projection exposure apparatus or resolution is proportionate to a wavelength of light used for exposure, and inversely proportionate to the numerical aperture ("NA") of the projection optical system. The shorter the wavelength is, the better the resolution is. Therefore, recent demands for finer processing to semiconductor devices have promoted use of a shorter wavelength of the UV light from an ultra-high pressure mercury lamp (i-line with a wavelength of about 365 nm) to KrF excimer laser (with a wavelength of about 248 nm) and ArF excimer laser (with a wavelength of about 193 nm). More recently, the light having a shorter wavelength is reduced to practice, such as $F_2$ laser (having a wavelength about 157 nm) as ultraviolet ("UV") light having a shorter wavelength and the extreme ultraviolet ("EUV") light.

In order to satisfy these requirements, a step-and-repeat exposure apparatus (also referred to as a "stepper") for projecting and exposing an approximately square exposure area all together onto a wafer with a reduced exposure area has been replaced mainly with a step-and-scan exposure apparatus (also referred to as a "scanner") for accurately exposing a wide screen of exposure area through a rectangular or arc slit with relatively and quickly scanning the reticle and the wafer.

In exposure, the scanner uses a surface position detector in an oblique light projection system to measure a height (or a surface position) of a certain position on the wafer before the exposure slit area reaches the certain position on the wafer, and correctly positions the wafer surface at the best focus position when exposing the certain position.

In particular, the exposure slit area has plural measurement points in longitudinal direction of the exposure slit, i.e., a direction perpendicular to the scan direction, to measure an inclination (tilt) of the surface as well as a height (focus) of the wafer's surface position. Japanese Patent Application, Publication No. 6-260391 (corresponding to U.S. Pat. No. 5,448,332) discloses, for example, a method for measuring the focus and tilt.

The projection exposure apparatus requires a highly precise alignment that aligns positions between the reticle and the wafer along with the fine processing to the circuit pattern (or the improvement of the resolution). The necessary precision for the alignment is generally about ⅓ of a circuit critical dimension and, for example, which is 60 nm that is ⅓ as long as the current design width of 180 nm.

In the alignment between the reticle and the wafer in each shot, positions of alignment marks that are exposed on the wafer for each shot are detected simultaneous with a detection of a circuit pattern on the reticle. The position of the alignment mark is detected by receiving the light from the alignment mark via an optical system and a CCD camera, signal-processing the obtained electric signal using various parameters, and positioning the wafer relative to the reticle based on the detection results. See, for example, Japanese Patent Application, Publication No. 6-260390 (corresponding to U.S. Pat. No. 5,703,685). The detection results include, for example, a wafer's magnification, a wafer's rotation, a shift amount, etc.

The recent, increasingly shortened wavelength of the exposure light and the higher NA of the projection optical system have required an extremely small depth of focus ("DOF") and stricter accuracy with which the wafer surface to be exposed is aligned to the best focus position. This accuracy is also referred to as the focus accuracy. A measurement error of a surface position detecting means cannot become negligible; the measurement error results from influence of a pattern on a wafer and an uneven coating thickness of the resist applied to the wafer.

For example, the resist's uneven coating thickness generates a step near a peripheral circuit pattern and a scribe line. The influence of the resist's uneven coating thickness is smaller than the DOF but is significant to the focus measurement. This step enlarges an inclined angle on a resist surface, and causes the reflected light detected by the surface position detecting means to offset from a regular reflection angle due to the reflections and refractions. The pattern density on the wafer causes a reflectance difference between a pattern crowded area and a coarse area. Since the reflected light detected by the surface position detecting means changes the reflecting angle and intensity, the detected waveform obtained from this reflected light contains an asymmetry that causes a measurement error, and a surface position on the wafer cannot be detected due to the remarkably lowered contrast in the detected waveform.

In general, the wafer process causes non-uniform pattern steps on a wafer surface and the uneven resist's coating thickness, resulting in the poor reproducibility in one wafer and among wafers and making the offset process difficult. This causes the exposure to stop since the wafer's surface position cannot be measured during the exposure, and the large defocus results in defective chips or lowered yield.

It is vital for the present semiconductor industry to improve the overlay accuracy of the wafer for high semiconductor device' performance and manufacture yield (or throughput). However, the wafer induced shift ("WIS") causes a large error (an asymmetry of alignment signal) in a detection result, and deteriorates the alignment accuracy. The factors include an asymmetry of an alignment mark and an asymmetry of the resist.

Various methods are proposed as measures for the alignment mark's asymmetry: For example, one method (1) maintains a wide illumination wavelength width for reduced influence of the thin film interference on the alignment mark. Another method (2) evaluates an exposure result after the alignment using prior several (send-a-head) wafers, and exposes subsequent wafers by feeding back the alignment offset amount to the exposure apparatus. Still another alignment method (3) uses a wavelength that irradiates plural lights having different wavelengths, and selects, for the alignment, one of the lights whose wavelength provides the maximum contrast in the alignment signal.

However, in order for the method (1) to completely eliminate the influence of the thin film interference of the resist, the method (1) requires a wavelength width twice as wide as the current illumination wavelength width of about 200 nm for the future thinning resist thickness, such as 200 nm to 300 nm. While the alignment optical system should correct the chromatic aberration for the wavelength width, it is technically very difficult to simultaneously correct the imaging positions and imaging magnifications for respective wavelengths. Therefore, the method (1) is unlikely to be viable.

The method (2) needs non-product wafers ("NPW") for offset calculations, and deteriorates the cost performance of the device manufacture because a 300 mm wafer that has already reduced to practice is so expensive per sheet. Moreover, the fluctuation of manufacture process varies steps and width of the alignment mark, and causes scattering errors that cannot be eliminated by the alignment offset.

The method (3) is likely to be implemented without increasing the NPW. However, the wavelength that provides the highest contrast in the alignment signal is not always closest to the wavelength that provides the least asymmetric errors of the alignment mark. Therefore, the alignment that uses the light having the wavelength that maximizes the contrast in the alignment signal does not always minimize the errors caused by the asymmetry of the alignment mark.

There are demands for position detecting method and apparatus and an exposure apparatus, which reduce the influence caused by the asymmetry of the alignment mark and provide highly precise position detections. In addition, there are other demands for an exposure method and apparatus, which realize a high focus accuracy relative to a small DOF, and improve the yield.

BRIEF SUMMARY OF THE INVENTION

A wavelength selecting method according to one aspect of the present invention for selecting a wavelength of light, the light being used to detect a position of a target with a signal from an image of an alignment mark covered with resist, includes the steps of obtaining a reflectance of the resist at a position outside the alignment mark by irradiating lights having plural wavelengths to the resist at the position, and selecting one of the lights which one has a wavelength that provides the maximum value of *reflectance among the reflectances measured by the measuring step or which one has a wavelength that falls within a predetermined wave range centering on the wavelength that provide the maximum reflectance.

A wavelength selecting method according to another aspect of the present invention for selecting a wavelength of light, the light being used to detect a position of a target with a signal from an image of an alignment mark covered with resist, includes the steps of previously storing, for each optical constant and coating thickness of the resist, a wavelength of light that maximizes a reflectance of the resist at a position outside the alignment mark, obtaining the optical constant and coating thickness of the resist, and selecting one of the wavelengths which one maximizes the reflectance of the resist and corresponds to the optical constant and coating thickness of the resist obtained by the obtaining step.

A position detecting method according to still another aspect of the present invention for detecting a position of a target using a signal from an image of an alignment mark coated with a resist, includes the steps of irradiating an alignment mark using light having a wavelength selected by using the above wavelength selecting method, and generating the signal from the light reflected from the alignment mark irradiated by the irradiating step.

A position detecting apparatus according to still another aspect of the present invention for detecting a position of a target using a signal from an image of an alignment mark formed on the target that is coated with resist, includes a selector for selecting the light having a wavelength that maximizes a reflectance of the resist at the position outside the alignment mark, and a signal processor for determining a position of the alignment mark relative to the signal generated from the light having the wavelength selected by the selector.

An exposure apparatus according to another aspect of the present invention for exposing a pattern on a reticle onto an object via a projection optical system, the exposure apparatus comprising the above position detecting apparatus, and using the position detecting apparatus for alignment of the object.

An exposure method according to another aspect of the present invention for exposing a pattern on a reticle onto an object via a projection optical system, includes the steps of aligning the object using light having a wavelength selected using the above wavelength selecting method, and projecting the pattern onto the object that has been aligned.

An exposure apparatus according to another aspect of the present invention for exposing a pattern on a reticle onto an object via a projection optical system, includes an irradiation unit for irradiating plural lights having different wavelengths onto two or more measuring points in each of the plural shots, a detector for detecting reflected light from the measuring points, a selector for selecting one of the wavelengths in accordance with the measuring positions of the plural shorts based on a detection result from the detector, and a calculator for calculating a position of each of the plural shots in an optical-axis direction based on the one of the wavelengths selected by the selector.

A wavelength selecting-method according to another aspect of the present invention for selecting a wavelength of light used to detect a position of a target, includes the steps of projecting an image of a pattern that includes plural elements using plural lights having different wavelengths onto measuring positions on plural areas of the target, and detecting a signal waveform from plural areas of the target, obtaining plural element intervals for each of the plural wavelengths based on the signal waveform detected by the detecting step, calculating a standard deviation of the plural element intervals at the measuring positions in the plural areas based on the plural element intervals, and selecting one of the wavelengths which one provides a minimum standard distribution calculated by the calculating step.

A wavelength selecting method for selecting a wavelength of light used to detect a position of a target, includes the steps of projecting an image of a pattern that includes plural elements using plural lights having different wavelengths onto measuring positions on plural areas of the target, and detecting a signal waveform from plural areas of the target, obtaining a signal contrast of the signal waveform for each of the plural wavelengths based on the signal waveform detected by the detecting step, and selecting one of the wavelengths which one provides a maximum contrast of the signal waveform for each of the plural wavelengths based on the signal waveform detected by the detecting step.

A wavelength selecting method for selecting a wavelength of light used to detect a position of a target, includes the steps of projecting an image of a pattern that includes plural elements using plural lights having different wavelengths onto measuring positions on plural areas of the target, and detecting a signal waveform from plural areas of the target, calculating a reflectance at the measuring position of light that passes the element based on the signal waveform detected by the detecting step, and selecting one of the wavelengths which one provides a maximum reflectance of the signal waveform for each of the plural wavelengths based on the signal waveform detected by the detecting step.

A wavelength selecting method for selecting a wavelength of light used to detect a position of a target, includes the steps of projecting an image of a pattern that includes plural elements using plural lights having different wavelengths onto measuring positions on plural areas of the target, and obtaining positional information indicative of the position, obtaining an approximate curved surface from an average of the wavelengths of the positional information obtained in the obtaining step, calculating an offset amount of the positional information from the approximate curved surface, and selecting one of the wavelengths which one minimizes scattering among the plural areas based on the offset amounts calculated by the calculating step.

An exposure method for exposing a pattern on a reticle onto plural shots on an object through a projection optical system, includes the steps of detecting a position of the object in an optical-axis direction using light having a wavelength selected by the above wavelength selecting method, and scanning the object in synchronization with the reticle, based on the position of the object in the optical-axis direction detected by the detecting step.

An exposure method for exposing a pattern on a reticle onto plural shots on an object through a projection optical system, includes the steps of detecting a position of the reticle in an optical-axis direction using light having a wavelength selected by the wavelength selecting method, and scanning the reticle in synchronization with the object, based on the position of the reticle in the optical-axis direction detected by the detecting step.

A device manufacturing method according to another aspect of the present invention includes the steps of exposing an object using the above exposure apparatus, and developing the object that has been exposed.

Other objects and further features of the present invention will become readily apparent from the following description of the preferred embodiments with reference to accompanying drawings.

BRIEF DESCRIPTION OF THE DRAWINGS

FIGS. 8A, 8B and 8C are views for explaining a template matching method applicable to the detection result shown in FIG. 7.

DETAILED DESCRIPTION OF THE PREFERRED EMBODIMENTS

First, the instant inventors have eagerly reviewed a relationship between a wavelength that provides the highest contrast in the alignment signal and a wavelength that provides the least asymmetric errors in the alignment mark, in order to provide the position detecting method and apparatus and exposure apparatus, which reduce the influence caused by the asymmetry of the alignment mark and provide highly precise position detections.

Figure 1:
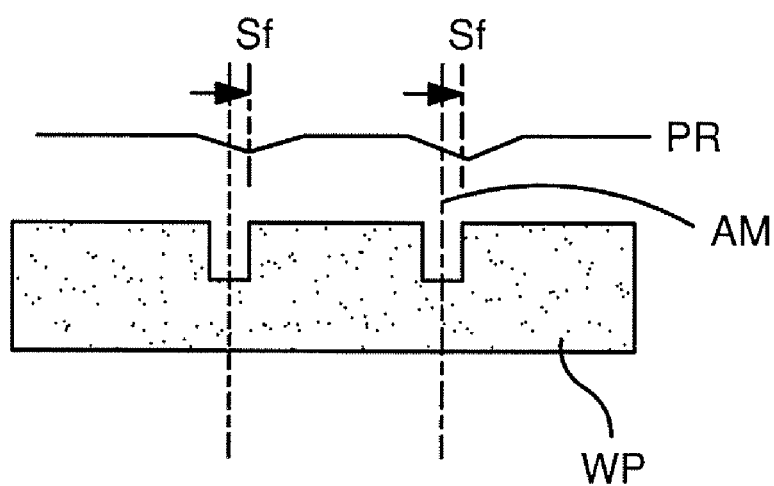
FIG. 1 is a sectional view showing a shape of an alignment mark.

The alignment mark's measurement errors ("alignment errors") due to the asymmetry of the uneven coating of the resist on the alignment mark and the contrast of the alignment signal are analyzed with a model shown in FIG. 1. FIG. 1 is a sectional view of alignment marks AM, and resist PR is applied onto the alignment mark AM. When the resist PR is applied on a wafer WP by the spin coat, the resist PR radially flows from the center to the outer circumference and produces uneven coating near the steps of the alignment marks AM as shown in FIG. 1. The uneven coating forms a concave apart from the alignment mark AM by a distance sf.

Figure 2:
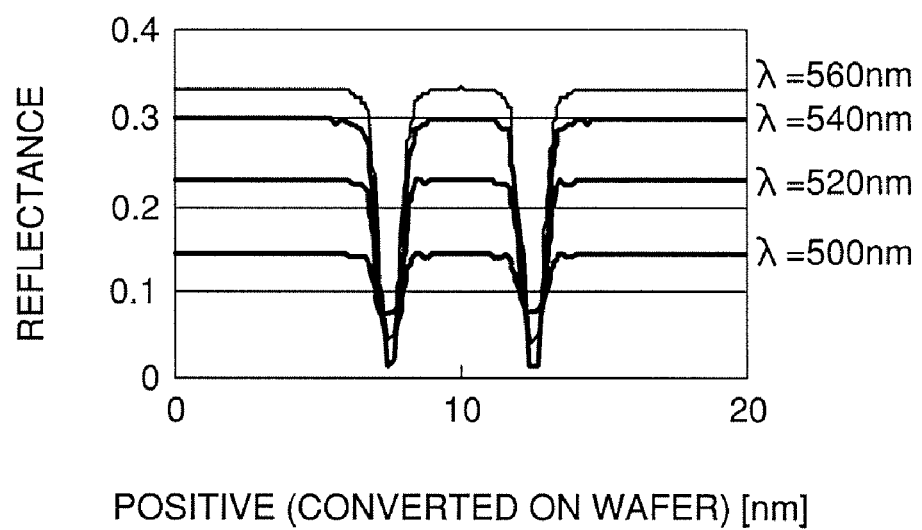
FIG. 2 is a view showing a simulation result of images of alignment marks AM shown in FIG. 1.

FIG. 2 shows a simulation result of the images of the alignment marks AM shown in FIG. 1. Referring to FIG. 2, the contrast of the alignment signal varies according to a wavelength of the alignment light that illuminates the alignment mark AM.

Figure 3:
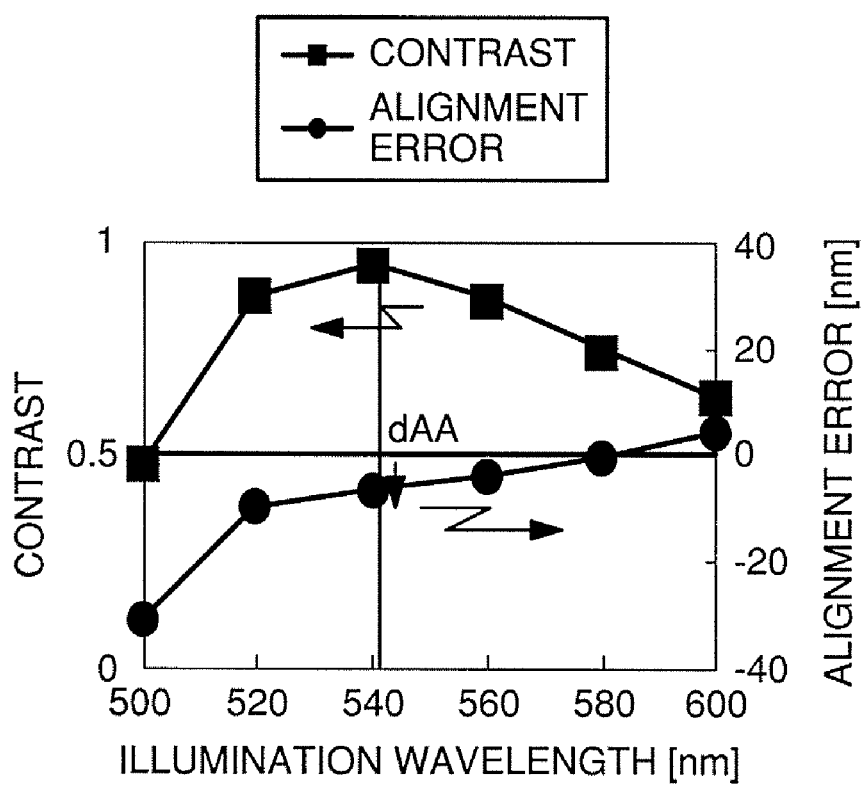
FIG. 3 is a view showing a relationship between an alignment error and a contrast of an alignment signal relative to a wavelength of illuminating alignment light.

FIG. 3 is a view showing a relationship between the contrast of the alignment signal relative to the wavelength of the illuminating alignment light, and the mark position calculated from the alignment signal. The mark position is based on a reference mark position in a case where there is no influence of the asymmetric component, and the alignment error is defined as an offset amount from the reference mark position. Referring to FIG. 3, when the alignment light has a wavelength of 540 nm, the contrast becomes maximum but the alignment error does not become zero; when the alignment light has a wavelength of 580 nm, the alignment error becomes zero. From this result, the instant inventors have discovered that the alignment light having the wavelength that maximizes the contrast does not always minimize the alignment error.

Figure 4:
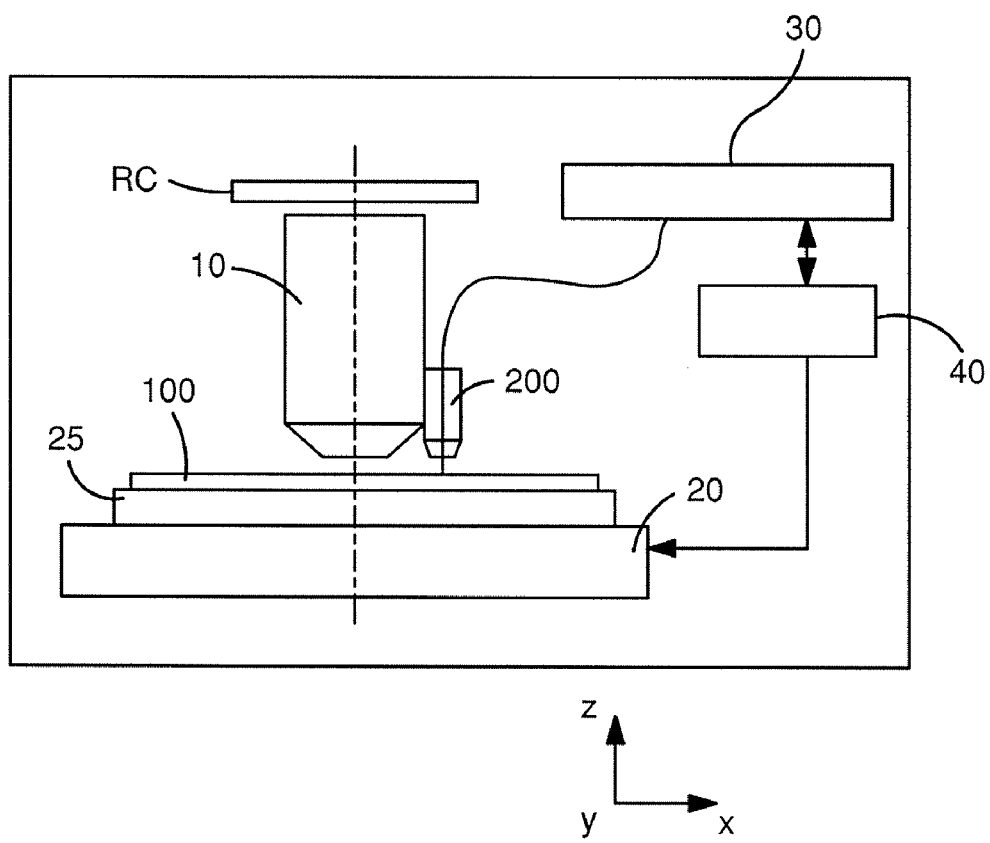
FIG. 4 is a block diagram showing a structure of an exposure apparatus according to one aspect of the present invention.

A description will now be given of preferred embodiments of the present invention, with reference to the accompanying drawings. The same element in each figure is designated by the same reference numeral, thus a description thereof will be omitted. FIG. 4 is a schematic view of an exposure apparatus 1 that uses an inventive position detecting method, and omits an illumination apparatus for illuminating the reticle RC, on which a circuit pattern is formed. The exposure apparatus 1 is a projection exposure apparatus that exposes onto a wafer the circuit pattern on a reticle, e.g., in a step-and-repeat or a step-and-scan manner. The exposure apparatus 1 includes, as shown in FIG. 4, a projection optical system 10 for projecting a reduced size of a reticle RC that has a desired pattern (such as a circuit pattern), a wafer chuck 25 that holds a wafer 100, onto which a primary coat pattern and alignment marks 110 have been formed in a pretreatment step, a wafer stage 20 that positions the wafer 100 at a predetermined position, an alignment optical system 200 that measures a position of the alignment mark 110 on the wafer 100, an alignment signal processor 30, and a controller 40. The alignment optical system 200, the alignment signal processor 30 and the controller 40 serve cooperatively as a position detecting apparatus for detecting a position of the wafer 100.

Figure 6:
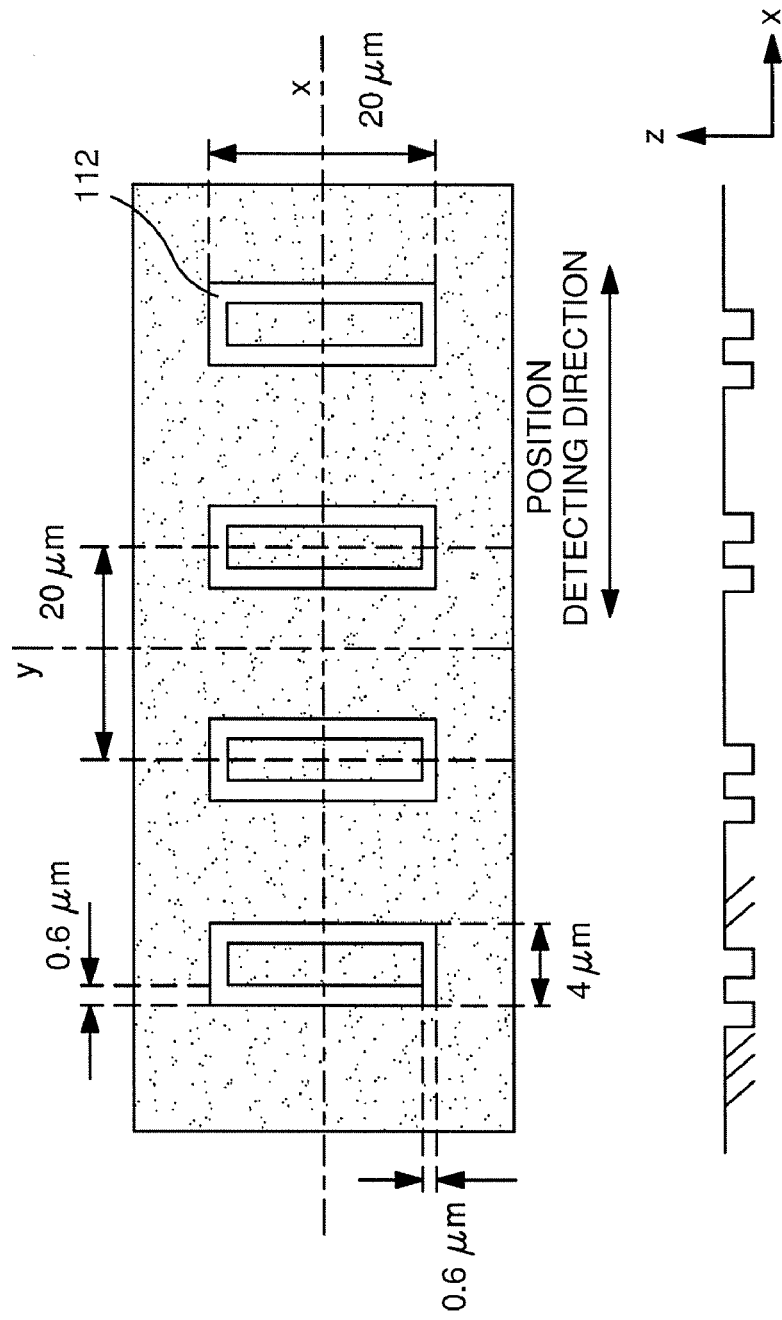
FIGS. 6A and 6B are views of one exemplary shape of an alignment mark.

The wafer 100 is an object to be exposed, onto which the alignment mark 110 shown in FIG. 6 is formed, and a photoresist is applied. The wafer 100 broadly covers a liquid crystal substrate and other objects to be exposed.

The wafer stage 20 supports the wafer 100 via the wafer chuck 25. The wafer stage 20 can apply any structure known in the art, and a detailed description of the structure and operation will be omitted.

Figure 5:
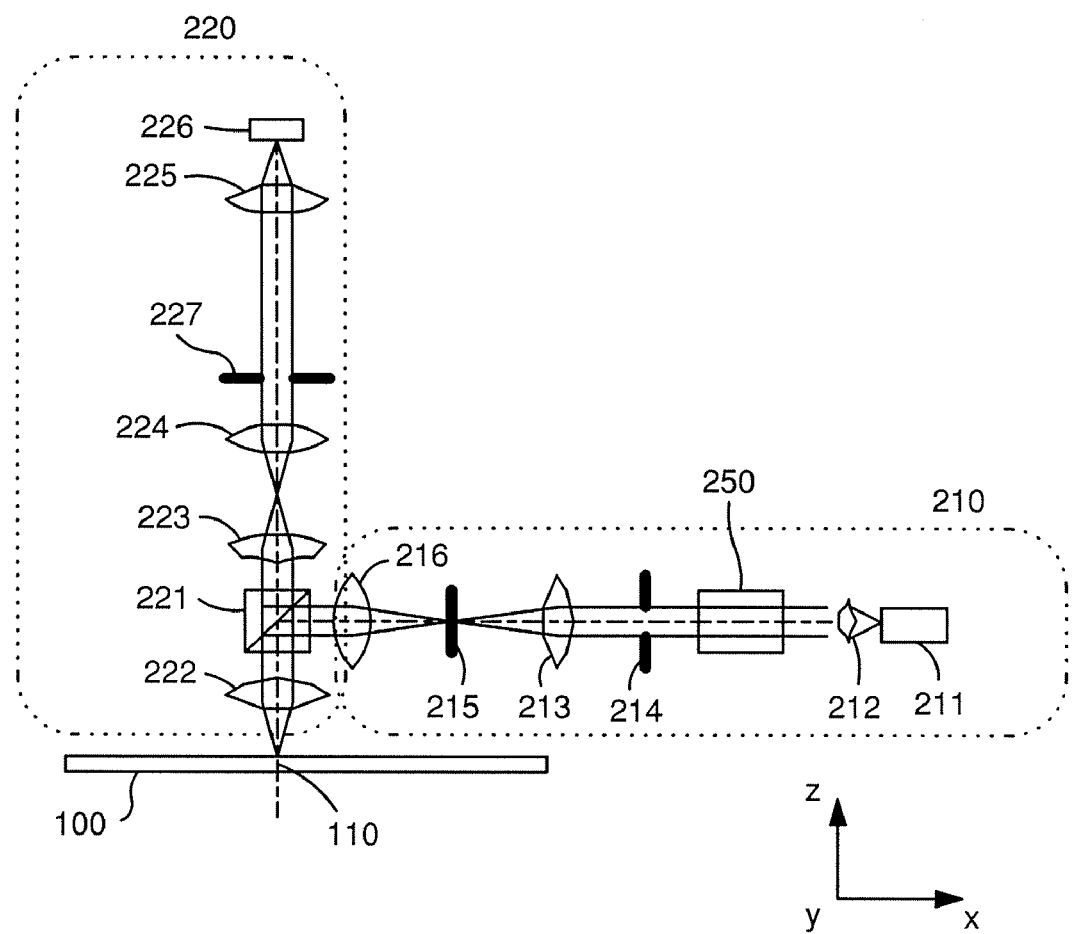
FIG. 5 is a block diagram showing principal components in an alignment optical system shown in FIG. 4.

The alignment optical system 200 detects the alignment mark 110 on the wafer 100, and measures a position of the wafer 100. FIG. 5 is a block diagram of principal components of the alignment optical system 200 shown in FIG. 4. FIG. 5 shows an exemplary optical system for detecting a position of the wafer 100 in an X direction. An optical system for detecting a position in a Y direction may use that for the x direction rotated by 90° around a z axis. The alignment mark 110 may use the mark for the x direction rotated by 90° around the x axis. A description will be given of an optical system for detecting a position of the wafer 100 in the x direction.

The alignment optical system 200 includes an illumination optical system 210, and an imaging optical system 220. A lens 212 enlarges and collimates illumination light (or alignment light) from an alignment light source 211, and the resultant light passes a wavelength selecting means 250 that selectively transmits an arbitrary wavelength. Then, a lens 213 condenses the resultant light again. During this period, a variable aperture stop 214 adjusts the coherency or coherence factor (σ) of the illumination light. An aperture 215 is located at a position conjugate with the wafer 100, and serves as a field stop for preventing unnecessary light from illuminating an area around the alignment mark 110 on the wafer 100.

The light condensed by the lens 213 is collimated by a lens 216, reflected by a beam splitter 221, passes through a lens 222, and illuminates the alignment mark 110 on the wafer 100. The light reflected from the alignment mark 110 passes through the lens 222, beam splitter 221, lenses 223, 224 and 225, and is received by a line sensor 226. A variable aperture stop 227 can adjust a numerical aperture ("NA") in the imaging optical system 220. The alignment mark 110 is imaged on the line sensor 226 while enlarged at an imaging magnification of about 100 times. The line sensor 226 can use a two-dimensional area sensor. Use of the area sensor enables the alignment marks for X and Y directions to be detected.

The alignment marks 110 are arranged on a scribe line for each shot. FIGS. 6A and 6B are plane and sectional views of one exemplary shape of the alignment mark 110. The alignment mark 110 arranges, as shown in FIG. 6, four rectangular mark elements 182A at a pitch of 20 μm in the X direction as a measuring direction, each of which has a size of 4 μm in the X direction and 20 μm in the non-measurement direction Y. The mark element 112 has a concave sectional shape that is formed by etching and has a rectangular contour defined by a line width (critical dimension) of 0.6 μm, as shown in FIG. 6B. Although the resist is applied to the actual alignment mark 110, FIG. 6 omits the resist.

Figure 7:
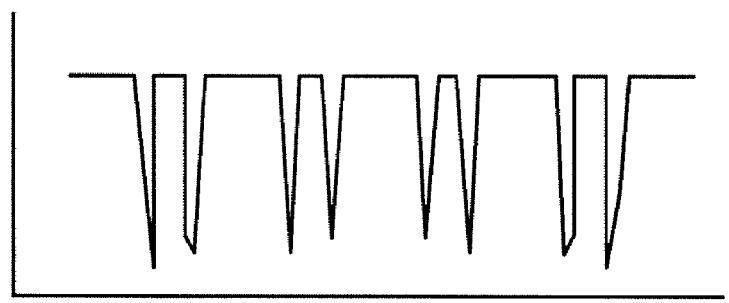
FIG. 7 is a view showing a typical optical detection result of an alignment mark shown in FIG. 6.

When the alignment mark 110 shown in FIG. 6 is used, the line sensor 226 generally takes an image as shown in FIG. 7, due to a generation and interference of scattered rays at a lens' edge outside a NA of the lenses 222 to 225 in the alignment optical system 200. The alignment mark 110 has a dark or bright concave part, as characterized and often observed by a bright field. Here, FIG. 7 is a graph showing a typical detection result when the alignment mark 110 shown in FIG. 6 is optically detected.

The alignment signal processor 30 signal-processes an image of the alignment mark 110, which has been thus taken. The alignment signal processor 30 in the instant embodiment uses template matching to calculate a position of the alignment mark 110. The template matching correlates an obtained signal S shown in FIG. 8B with a model signal (template) T shown in FIG. 8A, to which the template has been stored in the apparatus, and detects a position having the highest correlation as a center of the alignment mark. A resolution of 1/10 to 1/50 is available by calculating a barycenter pixel position in an area that ranges several pixels to the right and left from the peak pixel using a function of a correlation value E shown in FIG. 8C. Here, FIGS. 8A to 8C are views for explaining the template matching applicable to the detection result shown in FIG. 7.

The template matching is expressed by the following Equation 1, where S is a signal obtained by the sensor, T is a model signal, and E is a correlation result:

$$E(X) = \frac{1}{\sum_{J=-k}^{k} [S(X+J) - T(J)]^2} \quad \text{[EQUATION 1]}$$

FIG. 8 shows a relationship among the signal S, model signal T, and correlation values E. FIG. 8 shows processing to one mark-element image among four mark elements 112. As applied similarly hereinafter, the template matching detects image positions on the sensor for other three mark elements.

The mark-element image positions X1(n), X2(n), X3(n) and X4(n) (with unit of pixel) are calculated by using the template matching. Here, "n" is a template number. The entire center coordinate Xa(n) of the alignment mark 110 is determined as expressed by Equation 2 by averaging center positions X1(n) to X4(n) of four mark element images:

$$Xa(n) = \frac{X1(n) + X2(n) + X3(n) + X4(n)}{4} \quad \text{[EQUATION 2]}$$

Equation 3 calculates a positional offset Xw(n) of the alignment mark 110 on the wafer 100, where Xa is the average value of the mark image on the wafer 100 that has been obtained for each template, M is the imaging magnification of the alignment optical system 200, and Px is the pixel pitch of the line sensor 226 in the alignment measuring direction:

$$Xw(n) = \frac{Xa(n)}{Px \cdot M} \quad \text{[EQUATION 3]}$$

Based on Equation 3, the alignment signal processor 160 calculates a positional offset amount X1 of the alignment mark 110 from a best focus image signal obtained by the line sensor 226, and a positional offset amount X2 of the alignment mark 110 from the line sensor 226. The position X of the alignment mark 110 is determined by using the positional offset amounts X1 and X2 as in the following processing method.

A description will now be given of an alignment method for the wafer 100 based on measurement values of positions of the alignment mark 110. The instant embodiment adopts the advanced global alignment ("AGA"), which selects some shots (these selected shots are referred to as "sample shots") among all the shots (or chips) on a wafer, and detects positions of the alignment marks in the shots.

Figure 9:
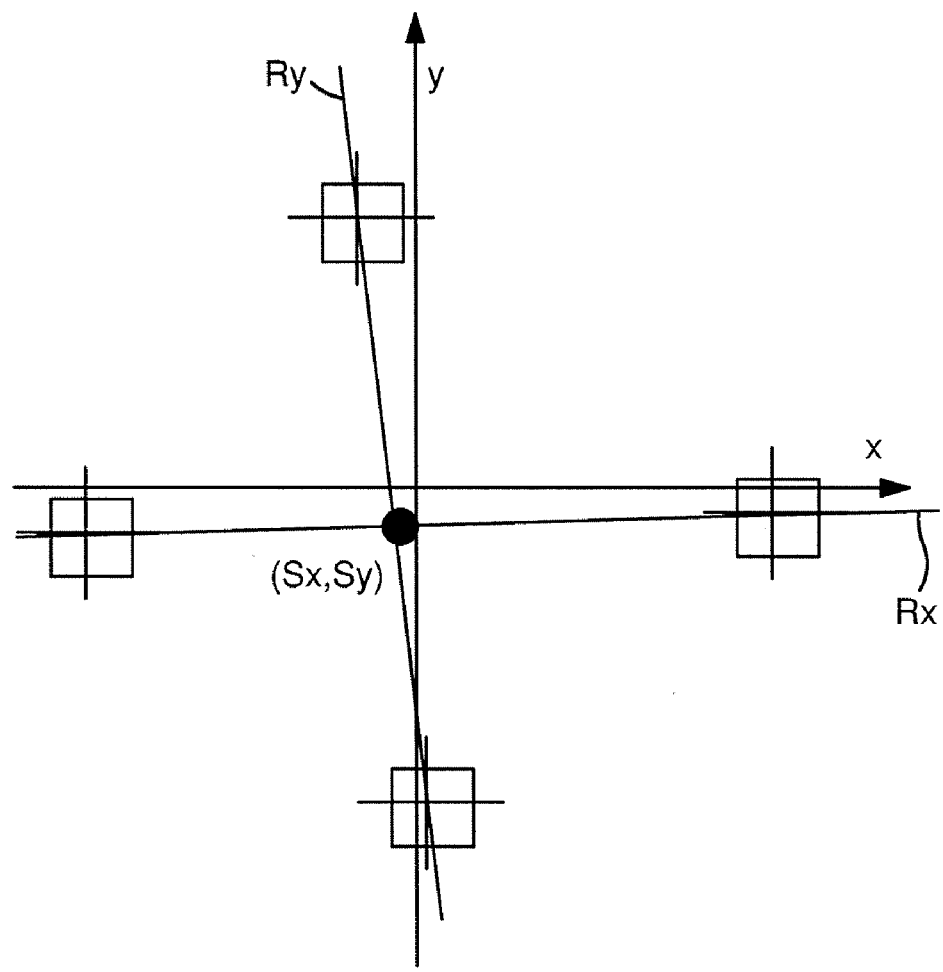
FIG. 9 is a view showing that a shot arrangement is offset on a wafer relative to a XY coordinate system on a wafer stage of the exposure apparatus shown in FIG. 4.

FIG. 9 shows an offsetting shot arrangement on the wafer 100 relative to the XY coordinate system on the wafer stage 20 in the exposure apparatus 1. An offset of the wafer 100 can be described with six parameters including a shift Sx in the direction x, a shift Sy in the direction y, an inclination θx to the x-axis, an inclination θy to the y-axis, a magnification Bx in the direction x, and a magnification By in the direction y. Bx and By represent an expansion and contraction of the wafer 110 based on wafer stage feeding in the exposure apparatus 1, and are caused by applying heat to the wafer 100 as in a film formation and etching in the semiconductor process.

Equations 4 and 5 are defined as follows, where Ai is measurement values for each measured AGA sample shot, Di is designed positional coordinates of the alignment mark 110 in the sample shot, and "i" is a measurement shot number:

$$Ai = \begin{bmatrix} xi \\ yi \end{bmatrix} \quad \text{[EQUATION 4]}$$

$$Di = \begin{bmatrix} Xi \\ Yi \end{bmatrix} \quad \text{[EQUATION 5]}$$

AGA conducts the primary coordinate conversion D'i expressed by Equation 6 using the above six parameters (Sx, Sy, θx, θy, Bx, By) that represent wafer's positional offsets:

$$D'i = \begin{pmatrix} Bx & -\theta y \\ \theta x & By \end{pmatrix} Di + \begin{pmatrix} Sx \\ Sy \end{pmatrix} \quad \text{[EQUATION 6]}$$

Equation 6 approximated θx and θy are minute (≈0) and Bx=By≈1, cos θ=1, sin θ=θ, θx·Bx=θx, θy·By=θy, etc.

Figure 10:
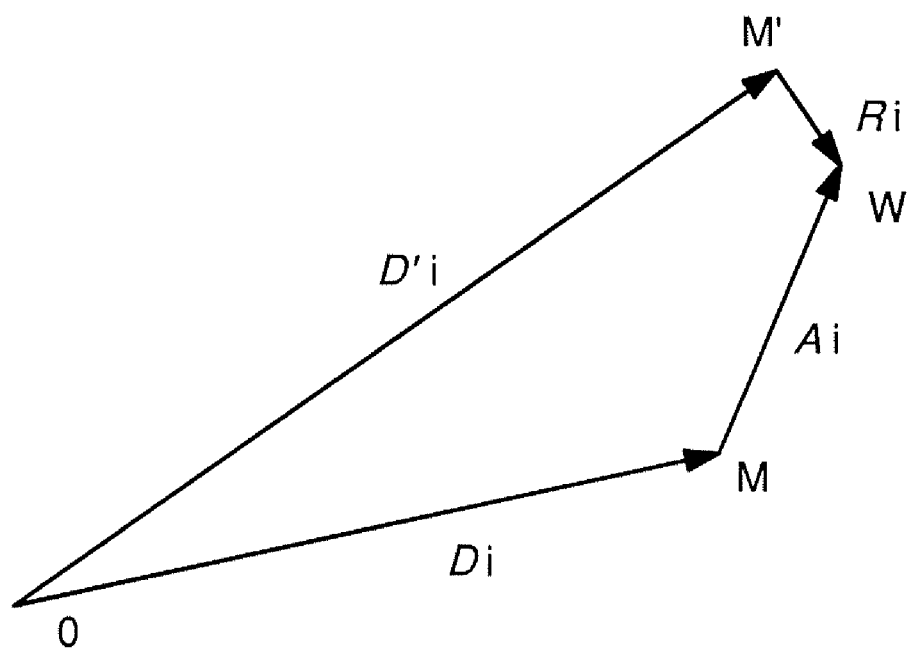
FIG. 10 is a vector diagram that shows a primary coordinate conversion expressed by Equation 6.

FIG. 10 shows a primary coordinate conversion of Equation 6. Referring to FIG. 10, the alignment mark 110 is located at a position W on the wafer 100, offset by Ai from a position M as a designed position, and shows a positional offset (or residue) Ri after the coordinate conversion D'i:

$$Ri=(Di+Ai)-Di' \quad \text{[EQUATION 7]}$$

AGA adopts the least square method to minimize the residue Ri for each sample shot, or calculates (Sx, Sy, θx, θy, Bx, By) that minimizes averaged square sum of the residue Ri using Equations 8 and 9 below:

$$V = \frac{1}{n}\sum |Ri|^2 = \quad \text{[EQUATION 8]}$$
$$\frac{1}{n}\sum_{i=1}^{t=n} \left| \begin{pmatrix} xi \\ yi \end{pmatrix} - \begin{pmatrix} Bx-1 & -\theta y \\ \theta x & By-1 \end{pmatrix}\begin{pmatrix} Xi \\ Yi \end{pmatrix} - \begin{pmatrix} Sx \\ Xy \end{pmatrix}\right|^2$$

$$\begin{pmatrix} \delta V/\delta Sx \\ \delta V/\delta Sy \\ \delta V/\delta Rx \\ \delta V/\delta Ry \\ \delta V/\delta Bx \\ \delta V/\delta By \end{pmatrix} = 0 \quad \text{[EQUATION 9]}$$

AGA parameters (Sx, Sy, θx, θy, Bx, By) are obtained by substituting for Equations 8 and 9, measurement values (xi, yi) for each sample shot and alignment-mark designed position (Xi, Yi). The exposure follows the alignment for each shot on the wafer 110 based on the calculated parameters.

Figure 11:
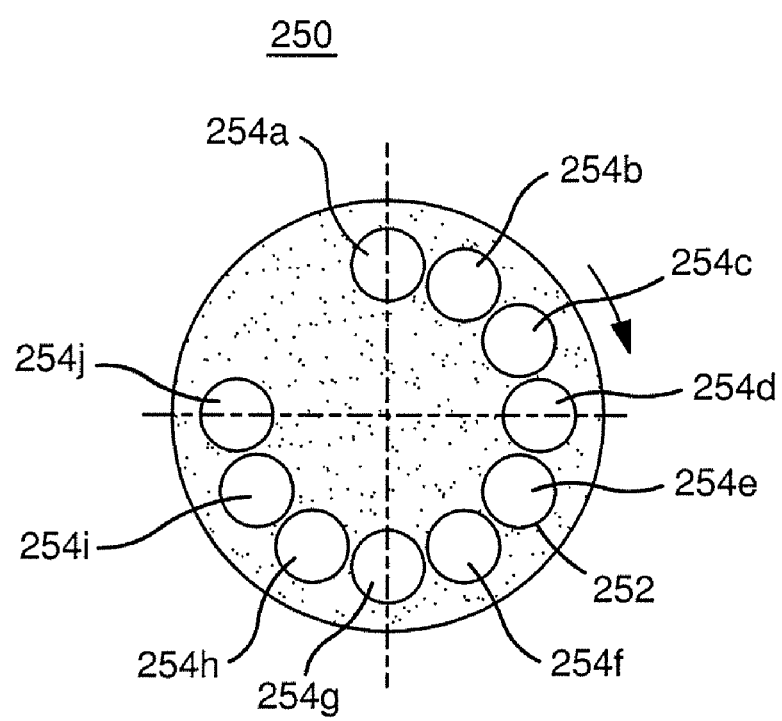
FIG. 11 is a plane view showing one exemplary structure of a wavelength selecting means in an alignment optical system shown in FIG. 5.
Figure 12:
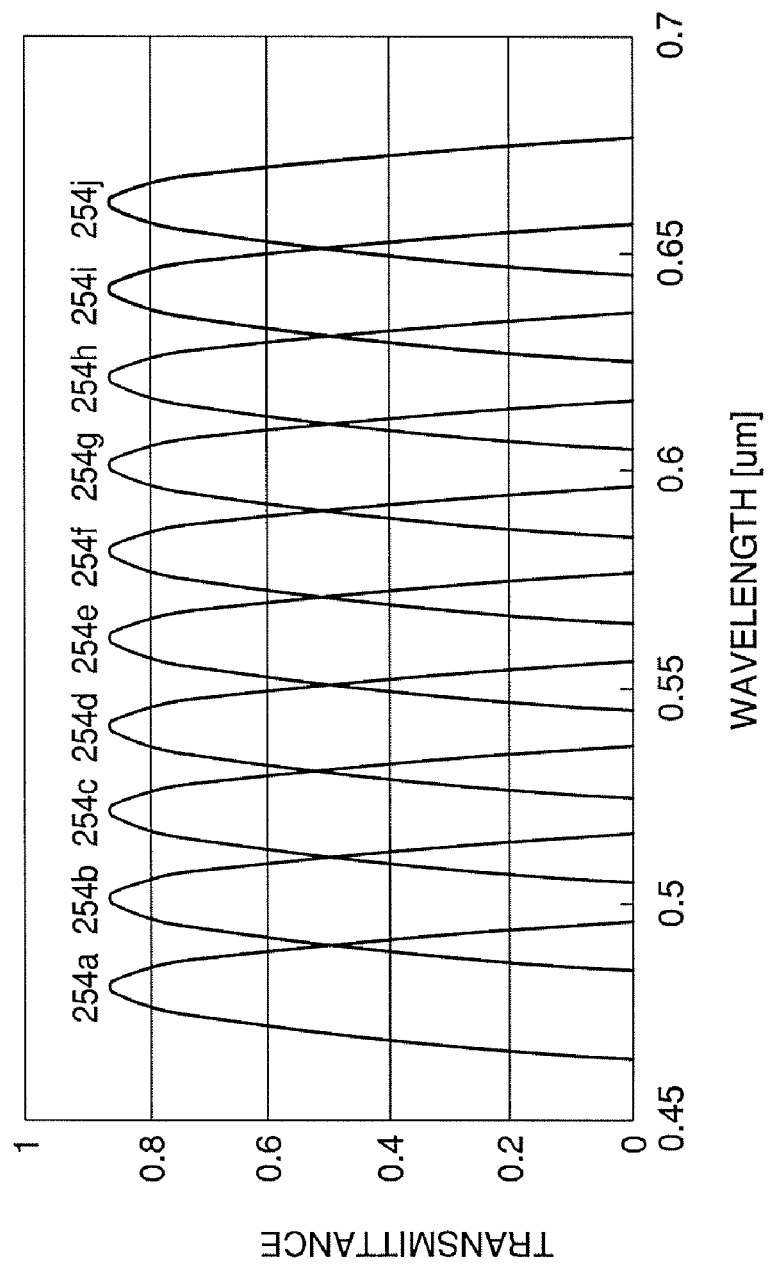
FIG. 12 is a spectral characteristic of a band-pass interference filter in the wavelength selecting means shown in FIG. 11.

A description will be given of the wavelength selecting means 250 in the alignment optical system 200 shown in FIG. 5. FIG. 11 is a plane view showing one exemplary structure of the wavelength selecting means 250 in the alignment optical system 200 shown in FIG. 5. Referring to FIG. 11, the wavelength selecting means 250 of the instant embodiment concentrically arranges ten band-pass interference filters 254a to 254j on a disc 252, and illuminates the alignment mark 110 with illumination light having an arbitrary wavelength that is determined by rotating the disc 252 and arranging arbitrary one of the band-pass interference filters 254a to 254j on an optical path of the illumination light. FIG. 12 is a spectral characteristic diagram of the band-pass interference filters 254a to 254j in the wavelength selecting means 250 shown in FIG. 11. Referring to FIG. 12, each of the band-pass interference filters 254a to 254j in the instant embodiment is configured to have a transmitting wavelength width of about 30 nm so that a transmitting center wavelength shifts by 20 nm.

The wavelength selecting means 250 can use a band-pass filter that is manufactured, for example, by combining a birefringence plate and a ferroelectric liquid crystal cell. Alternatively, the wavelength selecting means 250 may use a Ti sapphire laser or a combination of plural light sources having different wavelengths.

Figure 13:
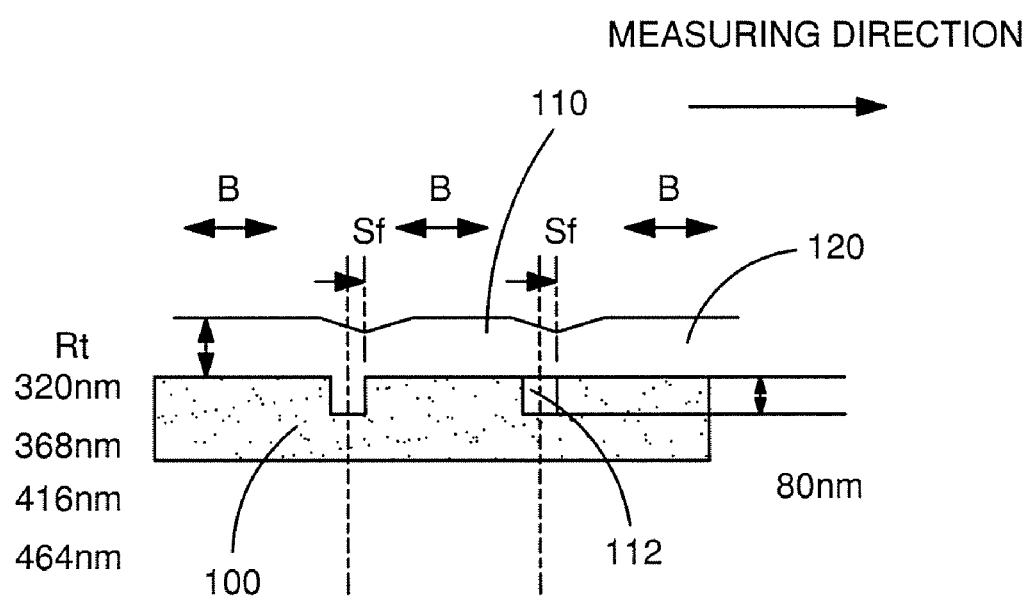
FIG. 13 is a sectional view showing a shape of an alignment mark.

A description will now be given of an optimal wavelength selecting method that is applicable when the shape of the alignment mark 110 has an asymmetric error. FIG. 13 is a sectional view of the alignment mark 110. The uneven coating of the resist 120 occurs so that a concave portion is formed at a position offset from the alignment mark 110 by Sf in the measuring direction. This embodiment uses the resist 120's coating thicknesses Rt of 320 nm, 368 nm, 416 nm, and 464 nm, calculates the alignment signal based on the simulation result of the alignment mark image for the wavelength of the illuminating alignment light, and obtains a position of the alignment mark 110 by using the above template matching. The alignment error is a difference between an ideal position of the alignment mark 110 on the wafer 100 where there is no asymmetric component, and a position (or a detected value) of the alignment mark 110 obtained from the alignment signal.

Figure 14A:
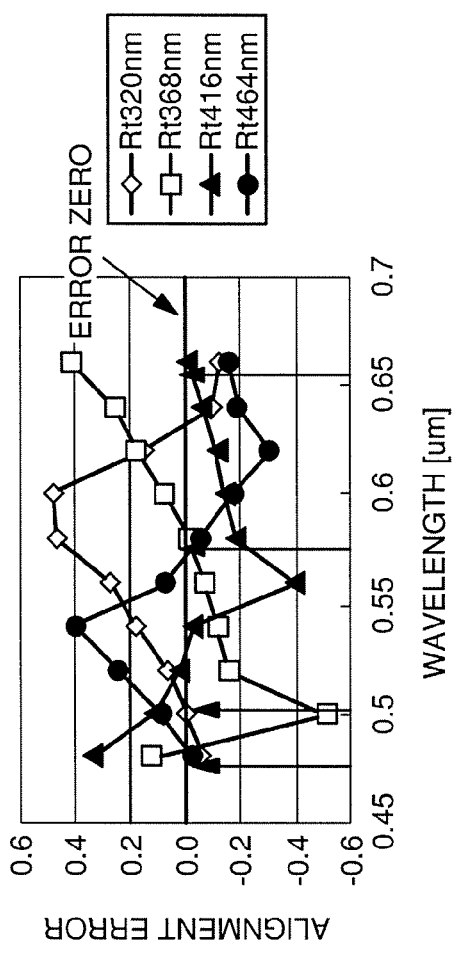
FIG. 14A is a view showing a relationship between a wavelength of the alignment light and an alignment error.

FIG. 14A is a view showing a relationship between the wavelength of the alignment light and the alignment error. In FIG. 14A, the abscissa axis is the wavelength of the alignment light, and the ordinate axis is the alignment error (an inclination of the alignment error relative to the shift amount of the resist 120 in FIG. 13). As shown in FIG. 14A, there is an alignment light' wavelength that provides alignment error of zero according to the coating thickness of the resist 120. This means that even when the resist 120 is unevenly coated, a proper selection of the wavelength of the alignment light that zeros the alignment error enables the position of the alignment mark 110 to be precisely detected on the wafer 100. Therefore, it is understood as discussed above that the wavelength selecting means 250 can preferably vary the wavelength of the alignment light at the pitches of 20 nm.

The instant inventors have addressed the resist 120 that is located outside the mark elements 112 or a non-mark part B (see the area B in FIG. 13), in order to select a wavelength that zeros the alignment error. The non-mark part B, as used herein, is defined as an area that is spaced from the edge of the mark element 112 by a predetermined distance, has a constant coating thickness and coating structure, and maintains the reflectance constant. When the alignment mark 110 includes plural mark elements 112 as in the instant embodiment, it is preferable that the space between the mark elements 112 is set to the non-mark part B.

Figure 14B:
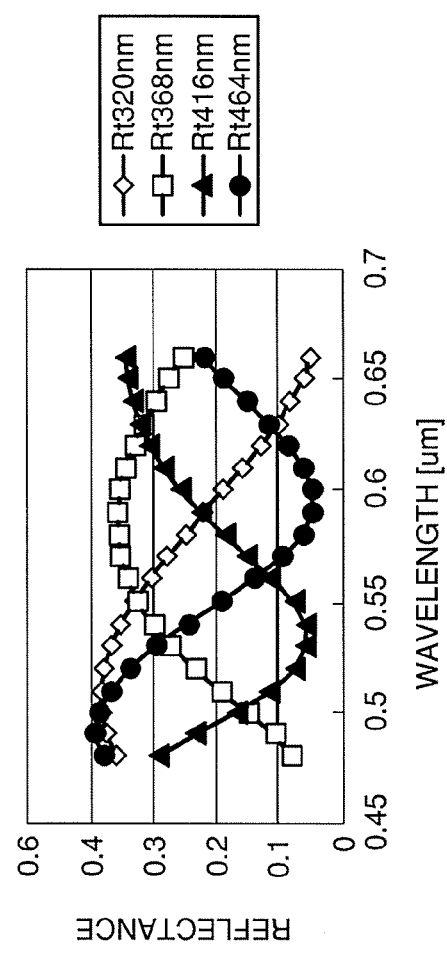
FIG. 14B is a view showing a spectral characteristic of a reflectance at a non-mark part shown in FIG. 13.

FIG. 14B is a spectral reflectance characteristic diagram at the non-mark part B shown in FIG. 13. Referring to FIGS. 14A and 14B, the alignment error is the smallest in an area that provides little changes of the reflectance of the non-mark part B, or at the wavelength that minimizes or maximizes the reflectance. This is because even when the resist 120 is applied asymmetrically with respect to both ends of the edge of the mark element 112 in the alignment mark due to a difference of the coating thickness of the resist 120, the reflectance difference caused by the coating thickness of the resist 120 is so small that the alignment signal maintains symmetry. Alternatively, this is because the asymmetric amount is small and the error is extremely small, and thus a position of the alignment mark 110 is detectable. While the alignment error becomes minimum at the wavelengths that minimize and maximize the non-mark part B, it is preferable to use the wavelength that maximizes the reflectance of the non-mark part B since the contrast of the alignment signal lowers in the bright field illumination at the wavelength that minimizes the reflectance of the non-mark part B.

A description will now be given of a method for calculating a wavelength that maximizes the reflectance at the non-mark part B. A first method acquires the alignment signal and compares the light intensity at the non-mark part B. The above AGA is conducted for plural wavelengths and the wafer 100 after the resist 120 is applied to the wafer 100, on which the alignment mark 110 has been formed. Then, the alignment signal is acquired for each wavelength and sample shot. Next, Isin($\lambda$) that is an average of alignment signal intensities at the non-mark parts B for all the sample shots is calculated for each wavelength $\lambda$. In order to correct the incident light intensity of the alignment light for each wavelength and the transmittance in the alignment optical system 200 for each wavelength, this embodiment uses the alignment optical system 200 to photograph a reference mark table that is installed on the wafer stage 20 and has a known spectral reflectance Rref($\lambda$). Similarly, the alignment signal's intensity Iref($\lambda$) is obtained for each wavelength in advance.

Thereby, the reflectance R($\lambda$) at the non-mark part B can be calculated by the following Equation 10:

$$R(\lambda)=Isin(\lambda) \times Rref(\lambda)/Iref(\lambda) \quad \text{[EQUATION 10]}$$

The instant embodiment calculates the reflectance R($\lambda$) at the non-mark part B from Equation 10, selects a wavelength that maximizes the reflectance, and uses the alignment light that has this wavelength.

Figure 15:
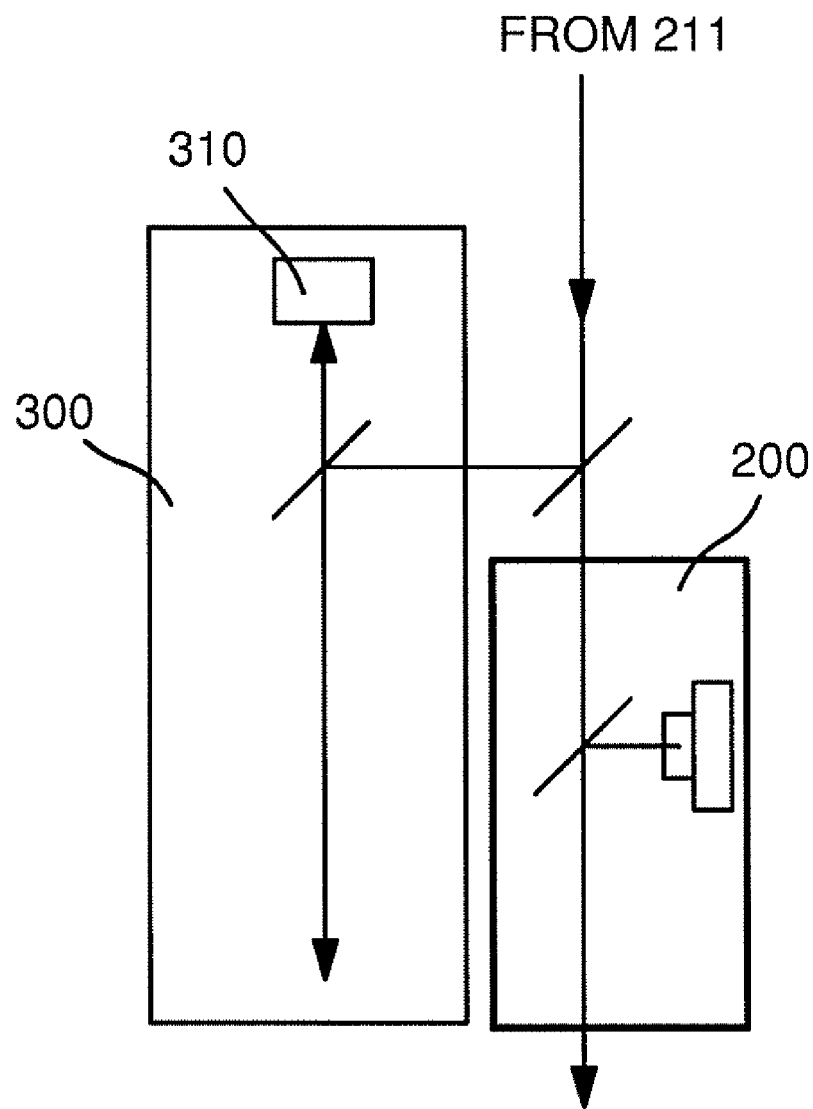
FIG. 15 is a block diagram showing one exemplary structure of a reflectance measuring unit.

In order to calculate the reflectance at the non-mark part B without using the line sensor 226 for generating the alignment signal, a reflectance measuring unit 300 may be provided, as shown in FIG. 15, which partially divides the illumination light from the alignment light source 211 in the alignment optical system 200, illuminates only the non-mark part B of the alignment mark 110, and measures the reflected light on a photodiode 310. The wafer 100 for obtaining the alignment signal may be exposed after the optimal wavelength is selected (which maximizes the reflectance of the non-mark part B), and the wafer 100 is aligned using the alignment light having this wavelength. Here, FIG. 15 is a block diagram of one exemplary structure of the reflectance measuring unit 300.

Figure 16:
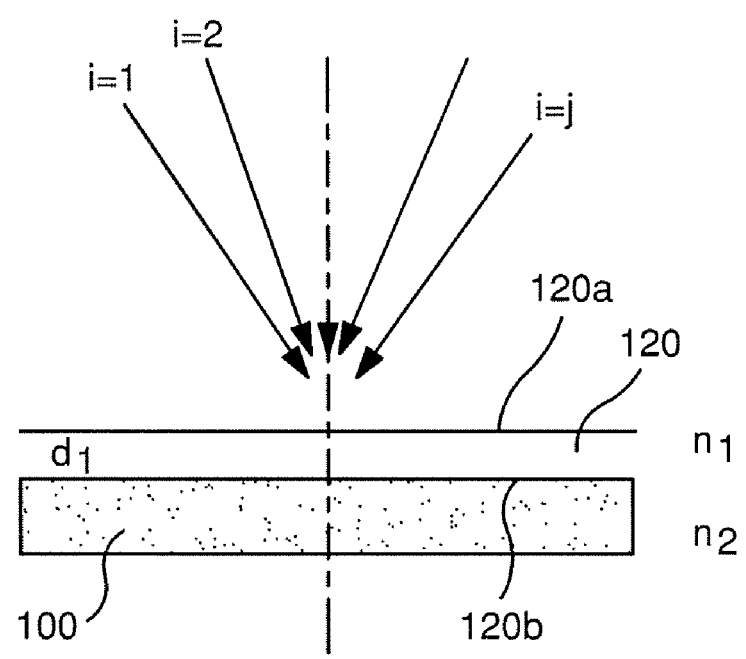
FIG. 16 is a view showing refractive indexes of a wafer and a resist and a coating thickness of the resist.

A second method for calculating a wavelength that maximizes the reflectance at the non-mark part B calculates the reflectance from the refractive index and coating thickness of the material of the alignment mark 110 (or the refractive index and coating thickness of the resist 120). As shown in FIG. 16, the reflectance Ri is given by the following Equation 11, where n1 is a refractive index of the resist 120, and n2 is a refractive index of the wafer 100. FIG. 16 is a view showing the refractive index and the coating thickness of the wafer 110 and the resist 120.

$$Ri = 1 - \frac{4n1^2 n2}{n1^2(1+n2)^2 + (n2^2 - n1^2)(1-n1^2)\sin^2 \delta i} \quad \text{[EQUATION 11]}$$

$\delta i$ is a phase difference between the reflected light from a front surface 120a of the resist 120 and the reflected light from a back surface 120b of the resist 120, and corresponds to a difference between their optical-path lengths. $\delta i$ is given by Equation 12 below, where d1 is a coating thickness of the resist 120, and $\theta i$ is an incident angle from the resist 120 to the wafer 100:

$$\delta i = \frac{2\pi}{\lambda} n1 d1 \cos\theta i \quad \text{[EQUATION 12]}$$

When the illumination light is perpendicularly incident upon the wafer 100, the wavelength $\lambda$ that maximizes the reflectance is given by Equations 13 and 14 below:

When $n1 < n2$, $n1 d1 = \lambda/2 + m\lambda/2$ ($m=0,1,2,\ldots$). [EQUATION 13]

When $n1 > n2$, $n1 d1 = \lambda/4 + m\lambda/2$ ($m=0,1,2,\ldots$). [EQUATION 14]

More specifically, the actual alignment optical system 200 often uses partial coherent illumination, and it is preferable to consider the oblique incident angle for the coherency $\sigma$ in addition to the perpendicular illumination for the calculation.

Since an optical-path length between the reflected light from the front surface 120a of the resist 120 and the reflected light from the back surface 120b of the resist 120 becomes longer in the oblique incident light than that in the perpendicular incident light, the wavelength that maximizes the reflectance shifts farther by about several nanometers towards the short wavelength side than that of the perpendicular incidence. A stricter calculation finds, as shown in FIG. 16, the reflectance Ri based on Equation 11 for each incident angle, where J is the number of incident rays corresponding to the coherency $\sigma$, and i is an incident ray number corresponding to the incident angle, then finds the reflectance R as an average value as expressed by Equation 15, and finally finds a wavelength that maximizes the reflectance:

$$R = \frac{1}{Ji} \sum_{i=1}^{J} Ri \quad \text{[EQUATION 15]}$$

The alignment may select one of the band-pass filters 254a to 254j in the wavelength selecting means 250 in the alignment optical system 200, which one has the closest central wavelength to the wavelength that maximizes the reflectance calculated from Equations 13, 14 or 15. The alignment may use the alignment light that has a wavelength in a predetermined range centering on the wavelength that maximizes the reflectance. The predetermined range is 30 nm centering on the wavelength that maximizes the reflectance. While the instant embodiment describes a calculation of the reflectance of a two-layer structure (i.e., the wafer 100 and the resist 120), the present embodiment is applicable to the alignment mark 110 that includes a multilayer coating, by using the known equation of the multilayer coating reflectance.

Alternatively, the exposure apparatus 1 may include an input part used by a user to input an optical constant and coating thickness of a material of the alignment mark 110 (resist 120), and a calculation unit that automatically calculates a wavelength that maximizes the reflectance at the non-mark part by using the input optical constant and coating thickness. The alignment light having a wavelength that is least affected by the asymmetry of the alignment mark 110 may be automatically selected and used for the alignment. An alternative embodiment previously stores the alignment light's wavelength that maximizes the reflectance at the non-mark part for each optical constant and coating thickness of the resist 120, acquires information of the resist 120, and selects the wavelength of the alignment light which maximizes the reflectance at the non-mark part from the database.

The instant embodiment applies the template matching as a signal processing method for detecting a position of the alignment mark 110 from the alignment signal, but may use another signal processing method, such as a return symmetric processing. The inventive wavelength selecting method can reduce alignment signal errors due to the asymmetry of the alignment mark 110, and achieve highly precise alignment.

While the instant embodiment ascribes the asymmetry of the alignment mark 110 to the uneven coating of the resist 120, the asymmetry of the alignment mark 110 is not exclusively caused by the resist 120 and can be caused by the asymmetric coating thickness of the opaque coating formed on the alignment mark 110.

Figure 17:
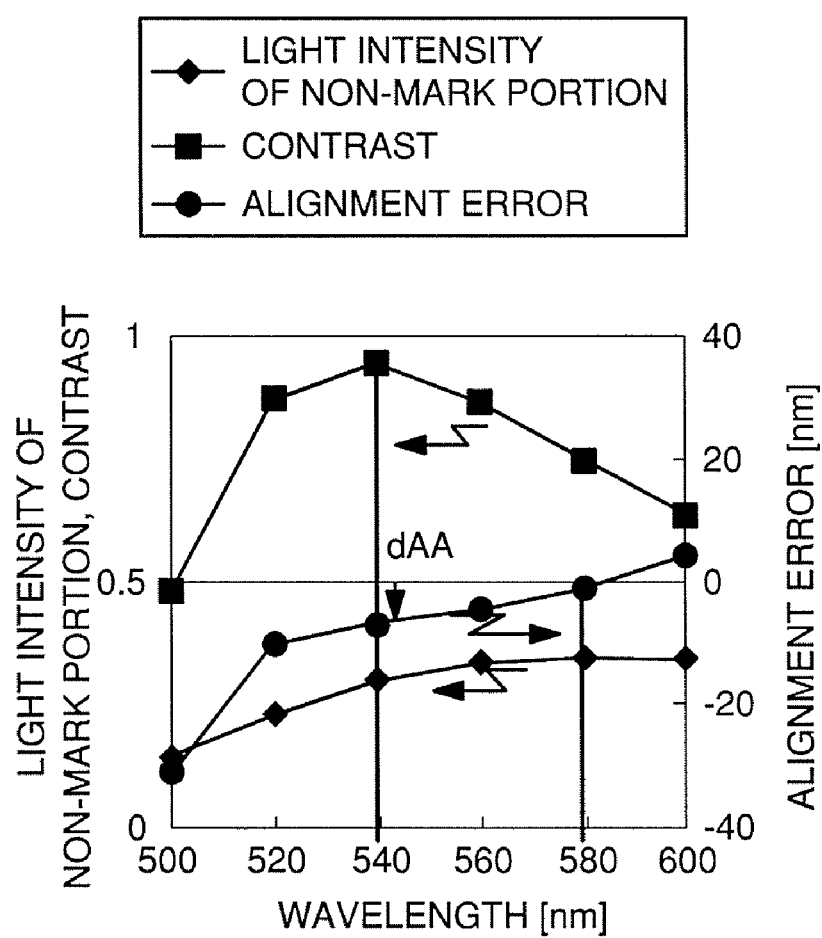
FIG. 17 is a view showing a relationship among the reflectance relative to a wavelength of the alignment light, a contrast of an alignment signal, and an alignment error.

FIG. 17 shows changes of the reflectance at the non-mark part for each wavelength when the alignment light that provides the highest contrast of the alignment signal is used but the alignment error cannot be eliminated. It is understood from FIG. 17 that the reflectance at the non-mark part becomes maximum when the wavelength of the alignment light is 580 nm, and corresponds to the wavelength that zeros the alignment error. In other words, the inventive wavelength selecting method can more effectively reduce the alignment errors than the selection of the wavelength of the alignment light based on the alignment signal's contrast. Here, FIG. 17 is a view showing a relationship between the reflectance to the alignment light's wavelength, the alignment signal's contrast, and the alignment error.

While the illumination optical system 210 in the alignment optical system 200 time-sequentially changes plural alignment lights having different wavelengths in the above embodiment and illuminates the alignment mark 110, the following embodiment uses an alignment optical system 200A that illuminates the alignment mark 110 using plural alignment lights having different wavelengths at the side of the illumination optical system 210 and divides the lights into signals having different wavelengths at the side of the imaging optical system 220.

Figure 18:
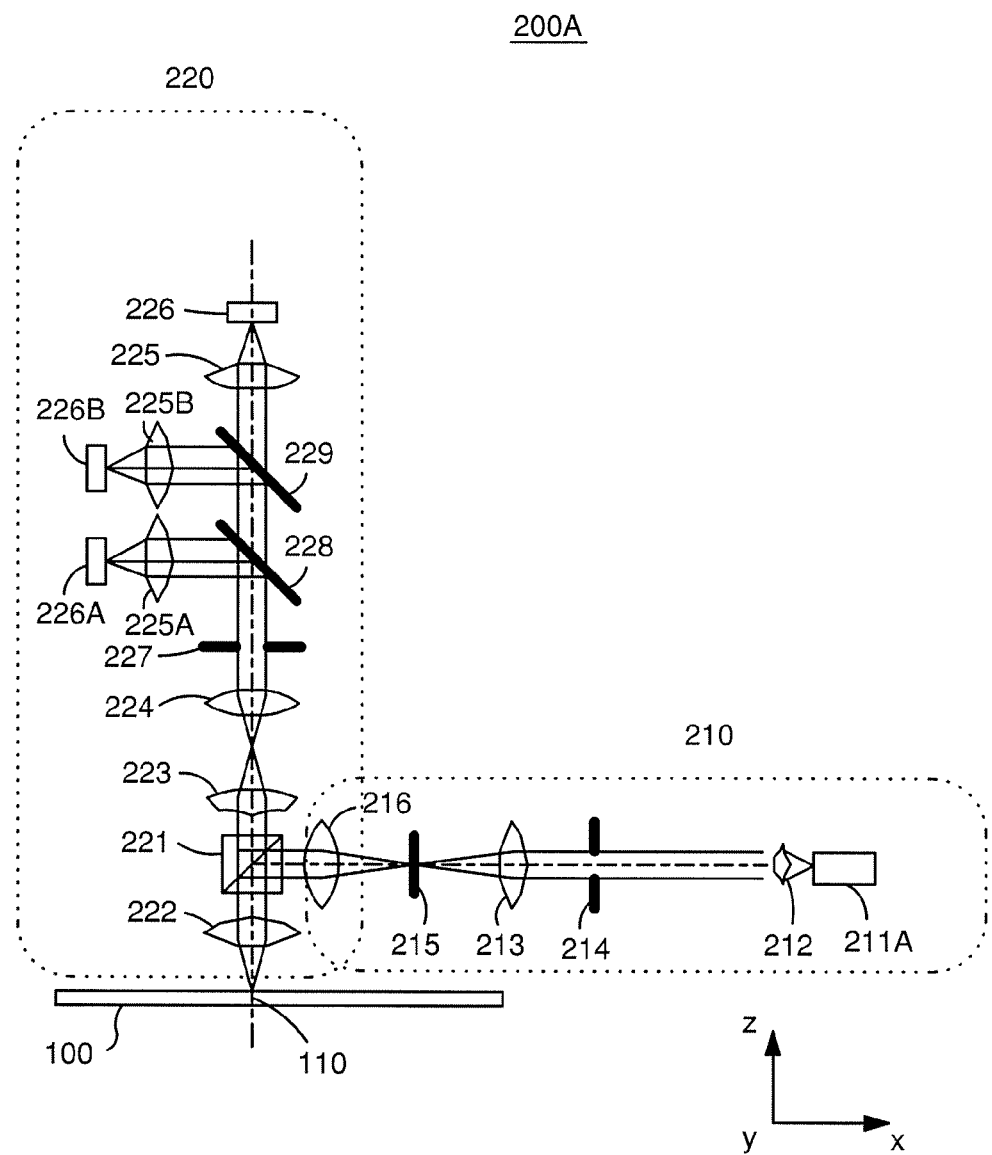
FIG. 18 is a block diagram of principal components in the alignment optical system.

FIG. 18 is a block diagram of principal components of the alignment optical system 200A. Referring to FIG. 18, the lens 212 enlarges and collimates illumination light from the alignment light source 211, and the lens 213 condenses the resultant light again. During this period, the variable aperture stop 214 adjusts the coherency (σ) of the illumination light. The aperture 215 is located at a position conjugate with the wafer 100, and serves as a field stop for preventing unnecessary light from illuminating an area around the alignment mark 110 on the wafer 100.

The light condensed by the lens 213 is collimated by the lens 216, reflected by the beam splitter 221, passes through the lens 222, and illuminates the alignment mark 110 on the wafer 100. The light reflected from the alignment mark 110 passes through the lens 222, beam splitter 221, lenses 223, 224 and 225, and is received by the line sensor 226.

Dichroic mirrors 228 and 229 are provided along the optical path of the imaging optical system 220. The light reflected from the dichroic mirror 228 is received by a line sensor 226A via a lens 225A, and the light reflected from the dichroic mirror 229 is received by a line sensor 226B via a lens 225B.

Figure 19:
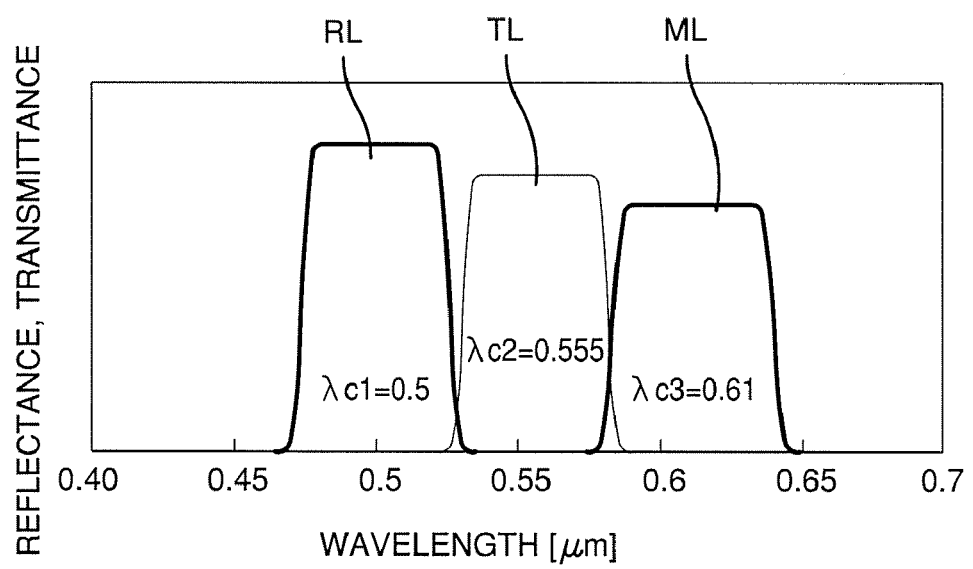
FIG. 19 is a view showing a spectral reflectance characteristic of a dichroic mirror shown in FIG. 18.

The designed spectral reflectance characteristic of the dichroic mirror 228 is as shown by RL in FIG. 19, and effectively reflects the light having a center wavelength of $\lambda c1=0.5$ μm and a wavelength width 50 nm, and transmits the light at the longer wavelength side. Therefore, the alignment signal generated by the line sensor 226A is formed by the light having a center wavelength of $\lambda c1=0.5$ μm and a wavelength width 50 nm.

The designed spectral reflectance characteristic of the dichroic mirror 229 is as shown by ML in FIG. 19, and effectively reflects the light having a center wavelength of $\lambda c3=0.61$ μm and a wavelength width 50 nm, and transmits the light at the longer wavelength side. Therefore, the alignment signal generated by the line sensor 226B is formed by the light having a center wavelength of $\lambda c1=0.61$ μm and a wavelength width 50 nm.

The light that passes the dichroic mirrors 228 and 229 and is received by the line sensor 226 is the light having a center wavelength of $\lambda c3=0.61$ μm and a wavelength width 50 nm as shown by TL in FIG. 19. Here, FIG. 19 is spectral reflectance characteristics of the dichroic mirrors 228 and 229 shown in FIG. 18.

Thus, the alignment optical system 200A uses three line sensors 226, 226A and 226B and simultaneously forms the alignment signals having different wavelengths of 0.50 μm, 0.555 μm, and 0.61 μm. The alignment optical system 200A has a more complicated structure of the imaging optical system 220 than the alignment optical system 200, but has a more advantageous throughput since the alignment optical system 200A can simultaneously generate the alignment signals having different wavelengths. Moreover, this embodiment uses the dichroic mirror to restrict the wavelength width, and arranges, on the optical path after the light separation, the chromatic aberration correcting means that corresponds to only the limited wavelength width, facilitating corrections to the chromatic aberration. While the instant embodiment uses the lights having three different wavelengths, the increased number of dichroic mirrors would provide more alignment signals having more wavelengths at fine wavelength pitches.

Figure 20:
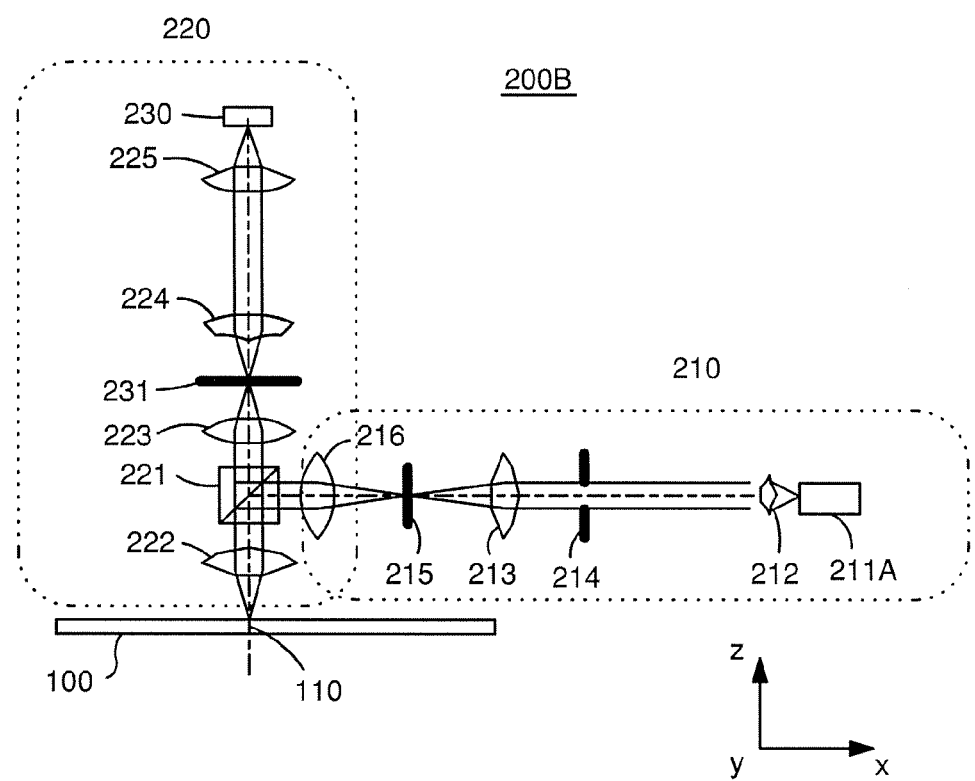
FIG. 20 is a block diagram of principal components in the alignment optical system as a variation of the alignment optical system shown in FIG. 18.

FIG. 20 is a block diagram of principal components in the alignment optical system 200B as a variation of the alignment optical system 200A shown in FIG. 18. The alignment optical system 200B characteristically uses a two-dimensional area sensor for the sensor 230, and divides the light into a direction perpendicular to the measuring direction of the alignment mark 110.

Referring to FIG. 20, the lens 212 enlarges and collimates illumination light from the alignment light source 211A for emitting plural lights having plural wavelengths, and the lens 213 condenses the resultant light again. During this period, the variable aperture stop 214 adjusts the coherency (σ) of the illumination light. The aperture 215 is located at a position conjugate with the wafer 100, and serves as a field stop for preventing unnecessary light from illuminating an area around the alignment mark 110 on the wafer 100.

The light condensed by the lens 213 is collimated by the lens 216, reflected by the beam splitter 221, passes through the lens 222, and illuminates the alignment mark 110 on the wafer 100. The light reflected from the alignment mark 110 passes through the lens 222, beam splitter 221, lenses 223, 224 and 225, and is received by the area sensor 230.

Figure 21:
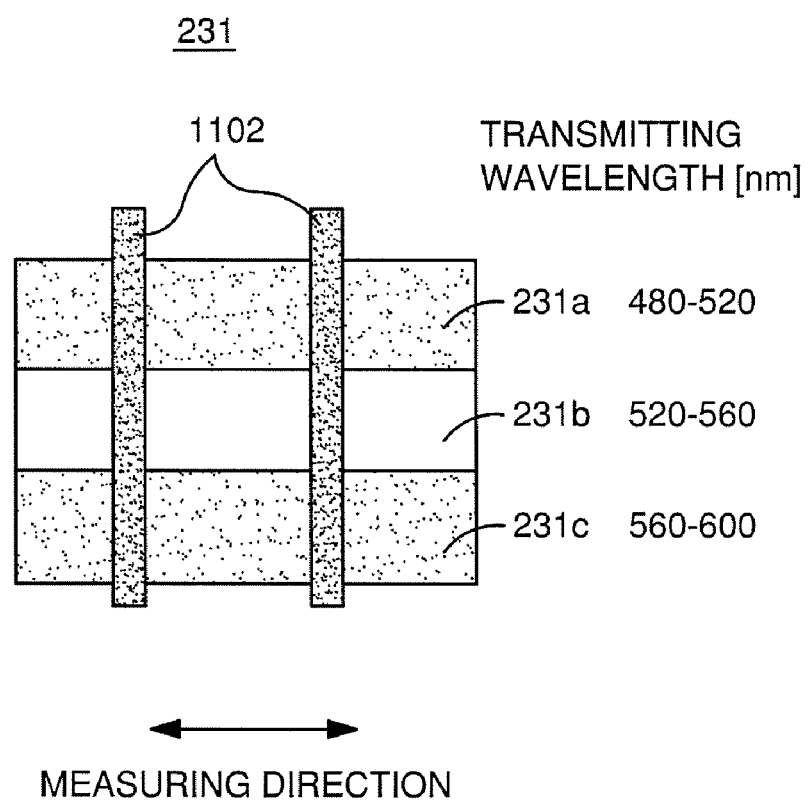
FIG. 21 is a schematic sectional view of a structure of a band-pass filter in the alignment optical system shown in FIG. 20.

A band-pass filter 231 is arranged, as shown in FIG. 21, at a position conjugate with the alignment mark 110 along the optical path of the imaging optical system 220. The band-pass filter 231 forms three types of band-shaped multilayer coatings 231a to 231c on a transparent plate, as shown in FIG. 21, in the direction perpendicular to the measuring direction of the alignment mark 110. The instant embodiment designs the transmission bands of the multilayer coatings 231a to 231c of 480 nm to 520 nm, 520 nm to 560 nm, and 560 nm to 600 nm, respectively. The band-pass filter 231 is located at a position conjugate with the alignment mark 110, and an image 110z of the alignment mark 110 is formed on the band-pass filter 231. Here, FIG. 21 is a sectional view of the band-pass filter 231 of the alignment optical system 200B shown in FIG. 20.

Figure 22:
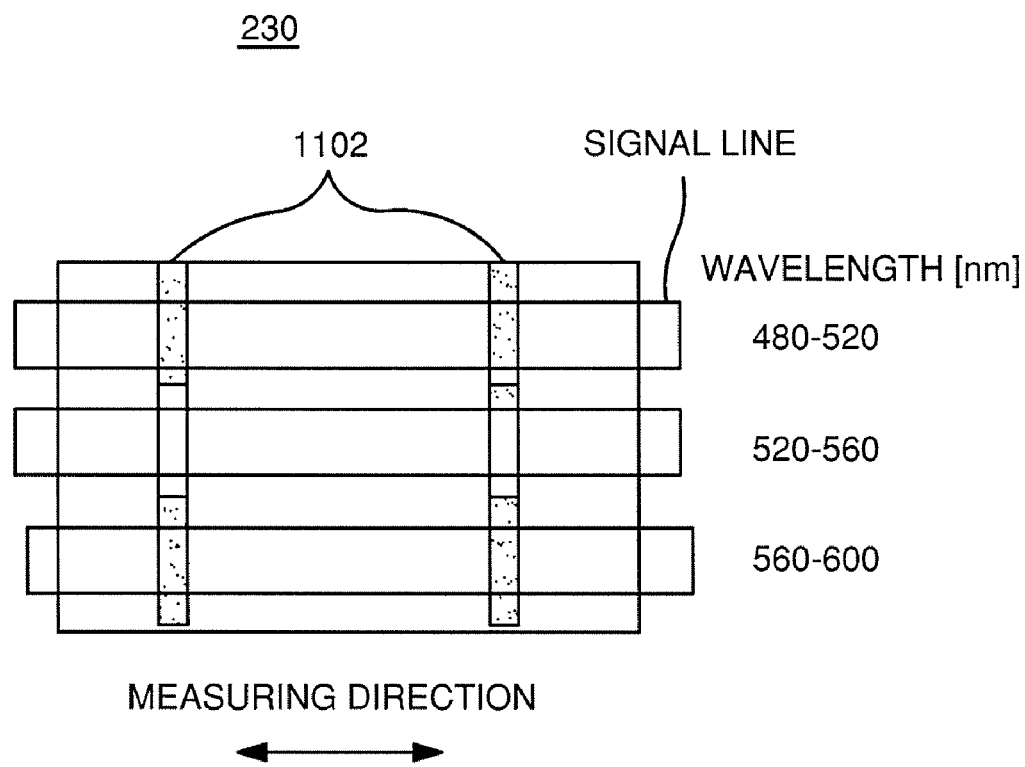
FIG. 22 is a plane view showing an image of an alignment mark on an area sensor in the alignment optical system shown in FIG. 20.

Since the area sensor 230 is also located at a position conjugate with the alignment mark 110 and the band-pass filter 231, the image 110z of the alignment mark 110 and the band-pass filter 231 are formed on the area sensor 230 again, as shown in FIG. 22. In other words, on the area sensor 230, the image 110a of the alignment mark 110 can be obtained when the alignment mark 110 is illuminated by the alignment light having a different wavelength in a direction perpendicular to the measuring direction of the alignment mark 110. Therefore, an alignment signal having a desired wavelength can be obtained, as shown in FIG. 22, by selecting a signal line of the area sensor 230. In other words, this embodiment selects a signal line corresponding to a wavelength within a predetermined range centering on the wavelength that maximizes the reflectance at the non-mark part of the alignment mark 110, and signal-processes the alignment signal generated from the signal line, and detects a position of the alignment mark 110 with high precision. Here, FIG. 22 is a plane view showing the image 110z of an alignment mark 110 on the area sensor 230 in the alignment optical system 200B shown in FIG. 20.

While the alignment optical system 200B uses the lights having three different wavelengths, an alternative embodiment can obtain more alignment signals having more wavelengths at finer wavelength pitches by increasing the number of multilayer coatings in the band-pass filter 231. The band-pass filter 231 can be arranged at the side of the illumination optical system 210. Since FIG. 20 arranges the band-pass filter 231 at a position of the aperture 215 conjugate with the alignment mark 110, the band-pass filter 231 may be provided at the transmission part (or opening part) of the aperture 215 so that the band-pass filter 231 serves as the field stop.

Figure 23:
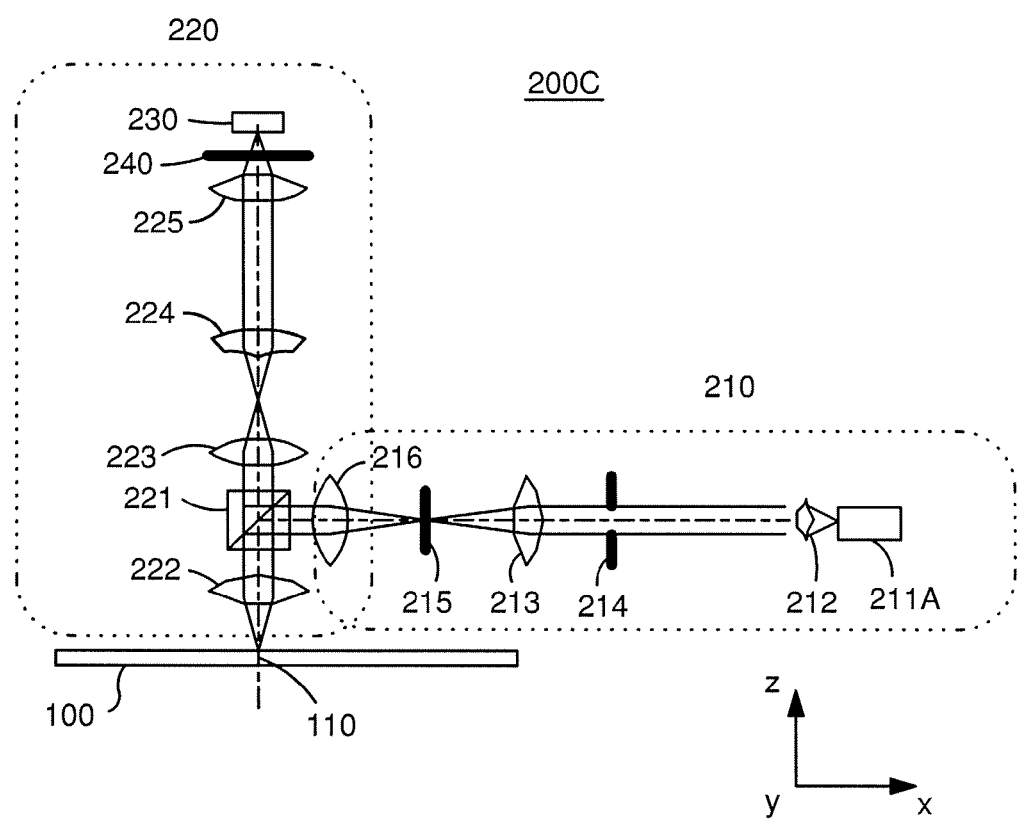
FIG. 23 is a block diagram of principal components in an alignment optical system as a variation of the alignment optical system shown in FIG. 20.

FIG. 23 is a block diagram of principal components in an alignment optical system 200C as a variation of the alignment optical system 200B shown in FIG. 20. While the alignment optical system 200C uses the two-dimensional area sensor for the sensor 230, similar to the alignment optical system 200B, the alignment optical system 200C characteristically uses a diffraction grating in a direction perpendicular to the measuring direction of the alignment mark 110.

Referring to FIG. 23, the lens 212 enlarges and collimates illumination light from the alignment light source 211A for emitting plural lights having plural wavelengths, and the lens 213 condenses the resultant light again. During this period, the variable aperture stop 214 adjusts the coherency (σ) of the illumination light. The aperture 215 is located at a position conjugate with the wafer 100, and serves as a field stop for preventing unnecessary light from illuminating an area around the alignment mark 110 on the wafer 100.

The light condensed by the lens 213 is collimated by the lens 216, reflected by the beam splatter 221, passes through the lens 222, and illuminates the alignment mark 110 on the wafer 100. The light reflected from the alignment mark 110 passes through the lens 222, beam splitter 221, lenses 223, 224 and 225, and is received by the area sensor 230.

Figure 24:
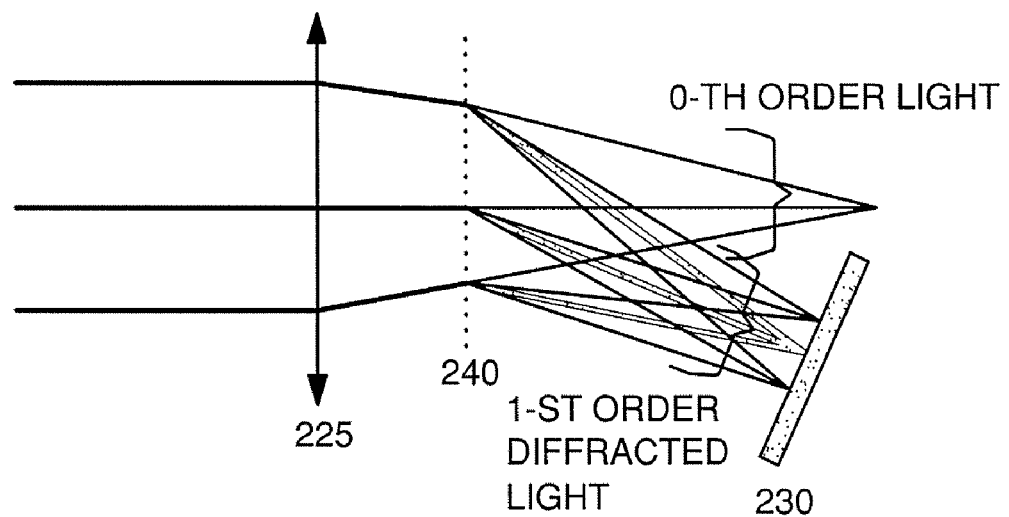
FIG. 24 is a sectional view showing a spectral operation of a diffraction grating in the alignment optical system shown in FIG. 23.

A diffraction grating 240 is provided between the lens 225 and the area sensor 230. The diffraction grating 240 arranges a grating in a direction perpendicular to the measuring direction of the alignment mark 110, and the light diffracted by the diffraction grating 240 is received by the area sensor 230 as shown in FIG. 24. Due to the spectral operation of the diffraction grating 240, the alignment mark 110 is imaged on the area sensor 230 by the lights having continuously different wavelengths in a direction perpendicular to the measuring direction of the alignment mark 110. Thereby, the alignment signal having an arbitrary center wavelength and wavelength width can be generated by arbitrarily selecting and averaging signal lines of the area sensor 230 in the direction perpendicular to the measuring direction of the alignment mark 110. Here, FIG. 24 is a sectional view showing a spectral operation of the diffraction grating 240 in the alignment optical system 230C shown in FIG. 23.

This embodiment can detect the position of the alignment mark 110 by selecting a signal line corresponding to the wavelength within a predetermined range centering on the wavelength that maximizes the reflectance of the non-mark part of the alignment mark 110, and signal-processing the alignment signal generated from the signal line. Since the alignment optical system 230C can form an image of the alignment mark corresponding to a wavelength that continuously changes in a direction perpendicular to the measuring direction of the alignment mark 110, the number of signal lines of the area sensors 230 can be arbitrarily selected with the high degree of freedom of selecting the central wavelength and wavelength width.

In order to implement the alignment, the alignment optical systems 200, 200A to 200C reduce the influence of the asymmetry of the alignment mark due to the semiconductor process, and improve the alignment accuracy and yield (or throughput) in the semiconductor device manufacturing process.

Turning back to FIG. 4, the controller 40 includes a CPU and a memory (not shown), and controls actions of the exposure apparatus 1. The controller 40 is electrically connected to the illumination apparatus (not shown), the reticle stage (not shown), and the wafer stage 20. The controller 40 positions the wafer 100 through the wafer stage 20 based on the positional information of the alignment mark 110 from the alignment signal processor 30. The CPU covers any processors irrespective of its name, such as an MPU, and controls each component's operation. The memory includes a ROM and RAM, and stores a firmware for operating the exposure apparatus 1.

In exposure, light emitted from an illumination apparatus (not shown), for example, Koehler-illuminates the reticle RC. The light that has passed the reticle RC and reflects the reticle pattern forms an image on the wafer 100 through the projection optical system 10. Since the alignment optical system 200 and alignment signal processor 30, etc. provide the exposure apparatus 1 with a highly precise alignment, the exposure apparatus 1 can provide excellent devices (such as semiconductor devices, LCD devices, image pick-up devices (such as CCDs), and thin film magnetic heads) with high throughput and economical efficiency.

Figure 25:
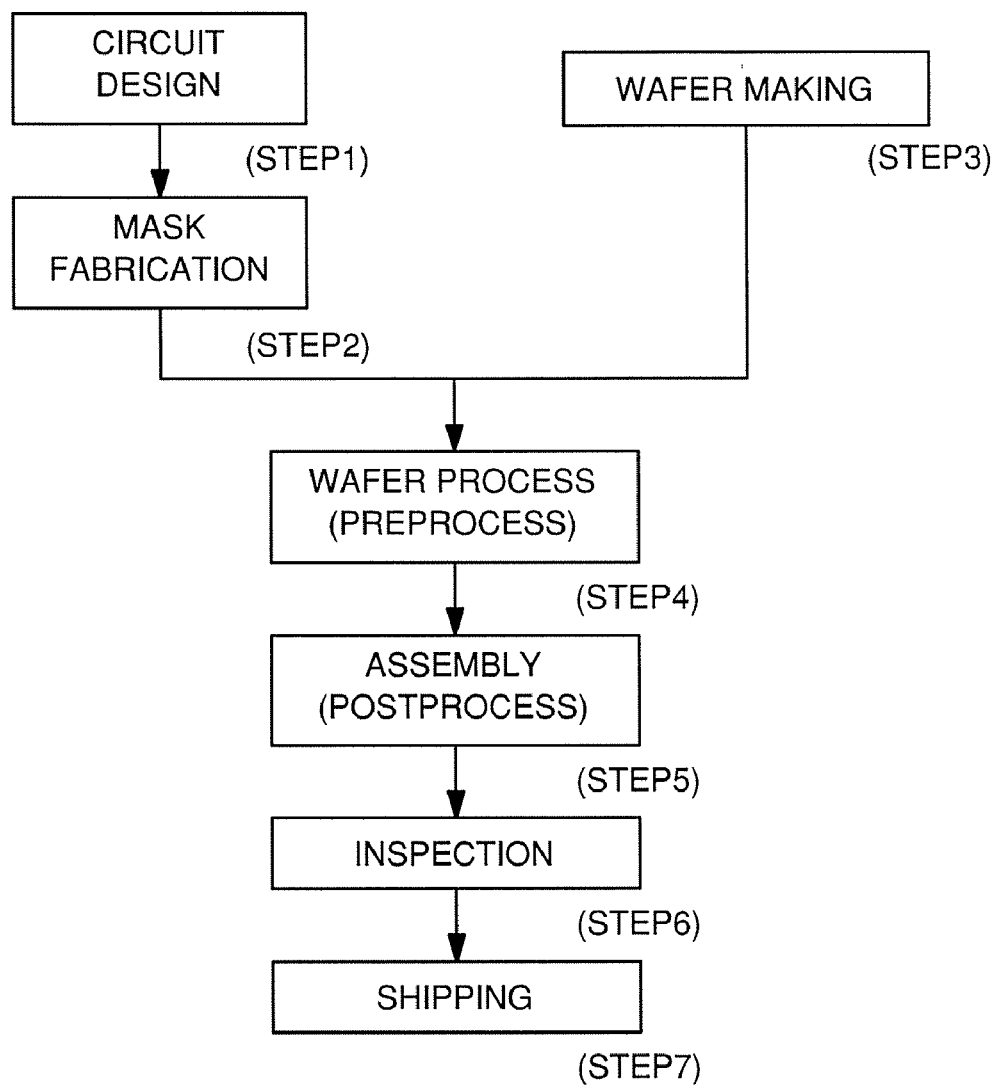
FIG. 25 is a flowchart for explaining a method for fabricating devices (semiconductor chips such as ICs, LSIs, and the like, LCDs, CCDs, etc.).
Figure 26:
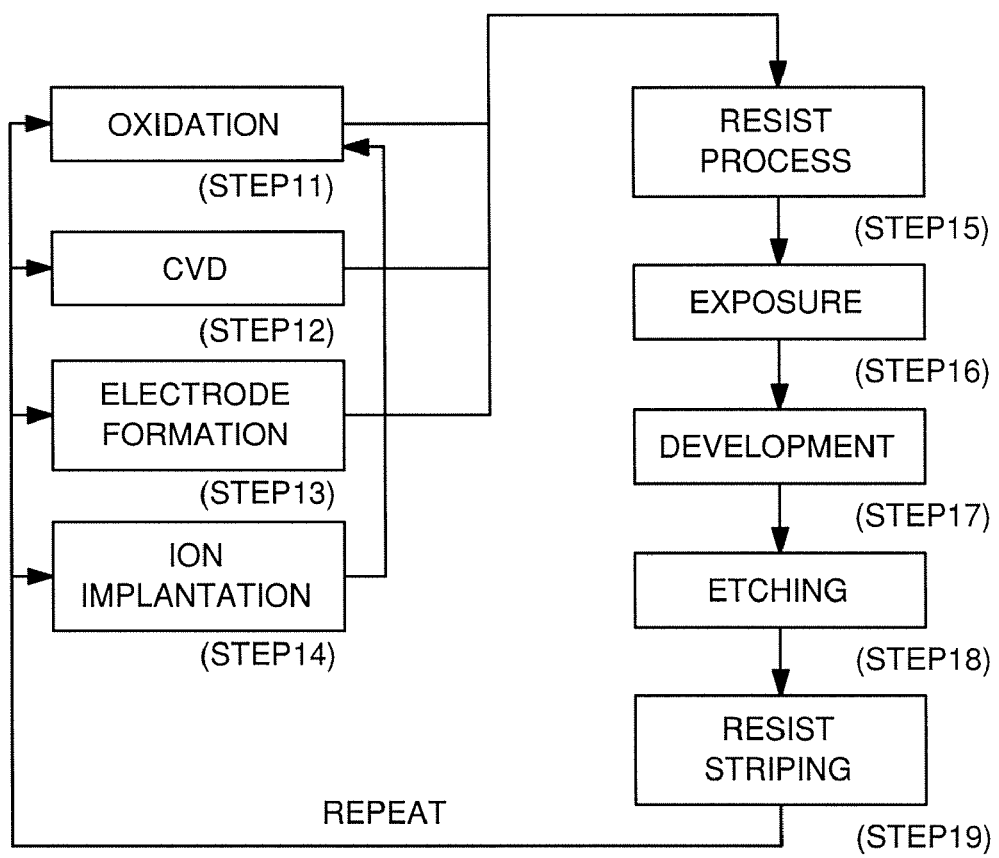
FIG. 26 is a detailed flowchart for Step 4 of wafer process shown in FIG. 25.

Referring now to FIGS. 25 and 26, a description will be given of an embodiment of a device manufacturing method using the above exposure apparatus 1. FIG. 25 is a flowchart for explaining the fabrication of devices (i.e., semiconductor chips such as IC and LSI, LCDs, CCDs, etc.). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 26 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose the circuit pattern on the mask onto the wafer. Step 17 (development) develops the exposed wafer. Step 18 (etching) etches parts other than the developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 1 and the resultant devices constitute one aspect of the present invention.

Figure 27:
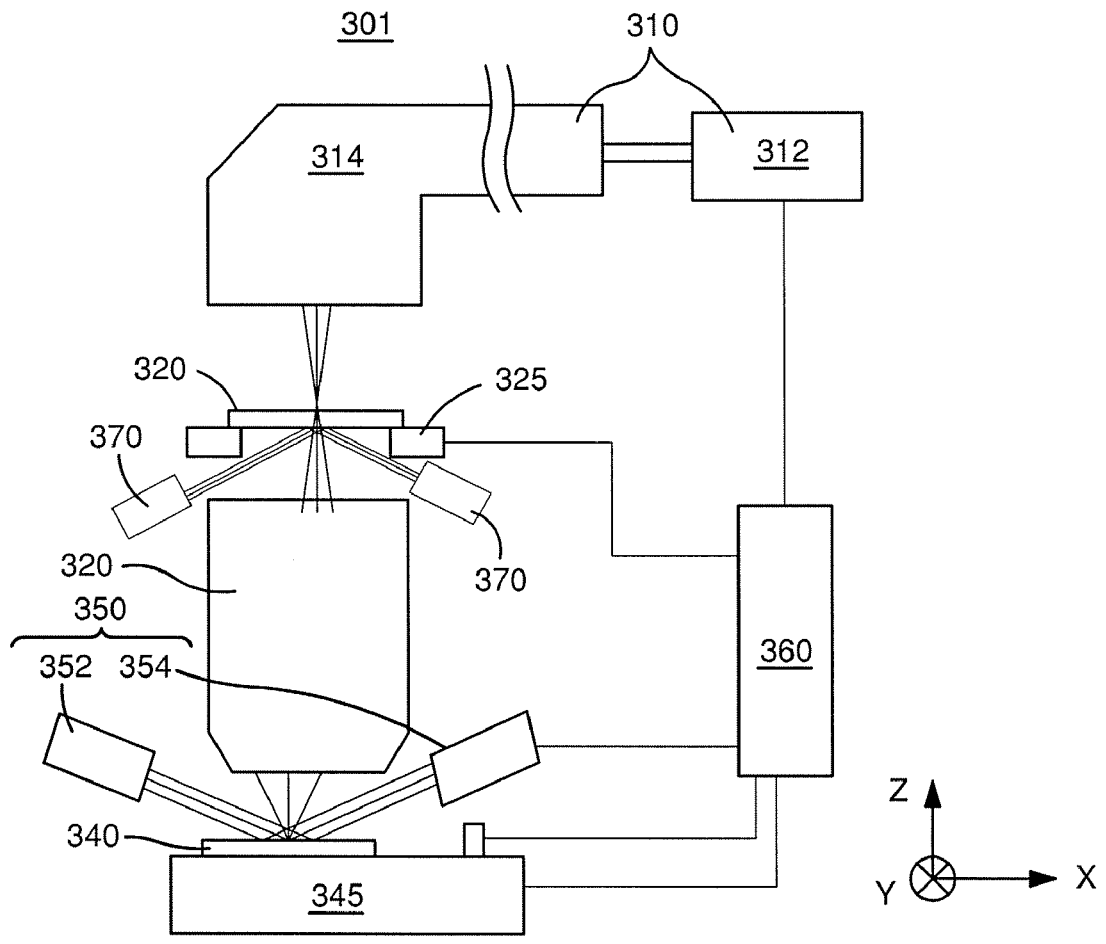
FIG. 27 is a schematic block diagram showing a structure of an exposure apparatus according to another aspect of the present invention.

Referring now to the accompanying drawings, a description will be given of the exposure apparatus 301 according to another embodiment of the present invention. While the previous embodiment is directed to a wavelength selection in detecting a position of an alignment mark on a wafer (or a position in a direction on the wafer plane), this embodiment is directed to a wavelength selection in the wafer's focus detection or a wafer's position in an optical-axis direction of the projection optical system. FIG. 27 is a schematic block diagram of a structure of the exposure apparatus 301 according to one aspect of the present invention.

The exposure apparatus 301 is a projection exposure apparatus that exposes onto a wafer the circuit pattern on a reticle 320 in a step-and-scan manner. Such an exposure apparatus is suitable for a sub-micron or quarter-micron lithography process. The exposure apparatus 301 includes, as shown in FIG. 27, an illumination apparatus 310, a reticle stage 325 mounted with the reticle 320, a projection optical system 330, a wafer stage 345 mounted with a wafer 340, a focus/tilt detecting system 350, and a controller 360. The controller 360 includes a CPU and a memory, is electrically connected to the illumination apparatus 310, the reticle stage 325, the wafer stage 345, and the focus/tilt detecting system 350, and controls the operations of the exposure apparatus 301. The controller 360 provides operations and controls for optimally setting the wavelength of the light used by the focus/tilt detecting system 350, which will be described later, to detect the surface position of the wafer 340 in the instant embodiment.

The illumination apparatus 310 illuminates the reticle 320, on which a circuit pattern to be transferred is formed, and includes a light source unit 312 and an illumination optical system 314.

The light source unit 312 uses as a light source, such as an ArF excimer laser with a wavelength of approximately 193 nm and a KrF excimer laser with a wavelength of approximately 248 nm, but a type of laser is not limited to excimer laser and a $F_2$ laser with a wavelength of approximately 153 nm and the extreme ultraviolet ("EUV") light having a wavelength of 20 nm or below can be used.

The illumination optical system 314 is an optical system that illuminates a target surface using the light emitted from the light source unit 312. The illumination optical system 314 in the instant embodiment converts the light into a predetermined form of exposure slit optimal to the exposure, and illuminates the reticle 320. The illumination optical system 314 includes a lens, a mirror, a light integrator, a stop, and the like, for example, a condenser lens, a fly-eye lens, an aperture stop, a condenser lens, a slit, and an imaging optical system in this order. The illumination optical system 314 can use any light whether it is axial or non-axial light. The light integrator may include a fly-eye lens or an integrator formed by stacking two sets of cylindrical lens array plates (or lenticular lenses), and be replaced with an optical rod or a diffractive element.

The reticle 320 is made, for example, of quartz, has a circuit pattern to be transferred, and is supported and driven by the maskstage 325. Diffracted light emitted from the reticle 320 passes the projection optical system 330, thus and then is projected onto the wafer 340. The reticle 320 and the wafer 340 are located in an optically conjugate relationship. The reticle 320 and the wafer 340 are scanned at the speed ratio of the reduction ratio, thus transferring the pattern on the reticle 320 to the wafer 340. The exposure apparatus 301 includes an oblique incident system of a reticle detecting means 370 for detecting a position of the reticle 320, and the reticle 320 is positioned in place.

The reticle stage 325 supports the reticle 320 via the reticle chuck (not shown), and is connected to a moving mechanism (not shown). The moving mechanism (not shown) includes a linear motor, etc., and can move the reticle 320 by driving the reticle stage 325 in the XYZ axes directions and rotating direction around each axis.

The projection optical system 330 serves to image the light from an object surface onto an image surface, and the diffracted light from the pattern on the reticle 320 onto the wafer 340 in this embodiment. The projection optical system 330 may use an optical system solely including a plurality of lens elements, an optical system including a plurality of lens elements and at least one concave mirror (a catadioptric optical system), an optical system including a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

The wafer 340 is an object to be exposed such as a wafer and a liquid crystal plate, and photoresist is applied onto it. The wafer 340 is also an object whose position is to be detected by the focus/tilt detecting system 350. The wafer 340 in another embodiment is replaced with a liquid crystal substrate or another object to be exposed.

The wafer stage 345 supports the wafer 340 via a wafer chuck (not shown). Similar to the reticle stage 325, the wafer stage 345 is moved by a linear motor in the XYZ axes directions and rotating direction around each axis. The positions of the reticle stage 325 and the wafer stage 345 are monitored, for example, by a laser interferometer and the like, so that both are driven at a constant speed ratio. The wafer stage 345 is installed on a stage stool supported on the floor and the like, for example, via a damper, and the reticle stage 325 and the projection optical system 330 are installed on a lens barrel stool (not shown) supported, for example, via a damper to the base frame placed on the floor.

The focus/tilt detecting system 350 in the instant embodiment obtains positional information of the surface position of the wafer 340 in the Z-axis direction during exposure. The focus/tilt detecting system 350 introduces lights to plural measuring points to be measured on the wafer 340, and then guide the lights to individual sensors, and detect the tilt of the exposure surface from the positional information of the different positions (or the detection result).

Figure 28:
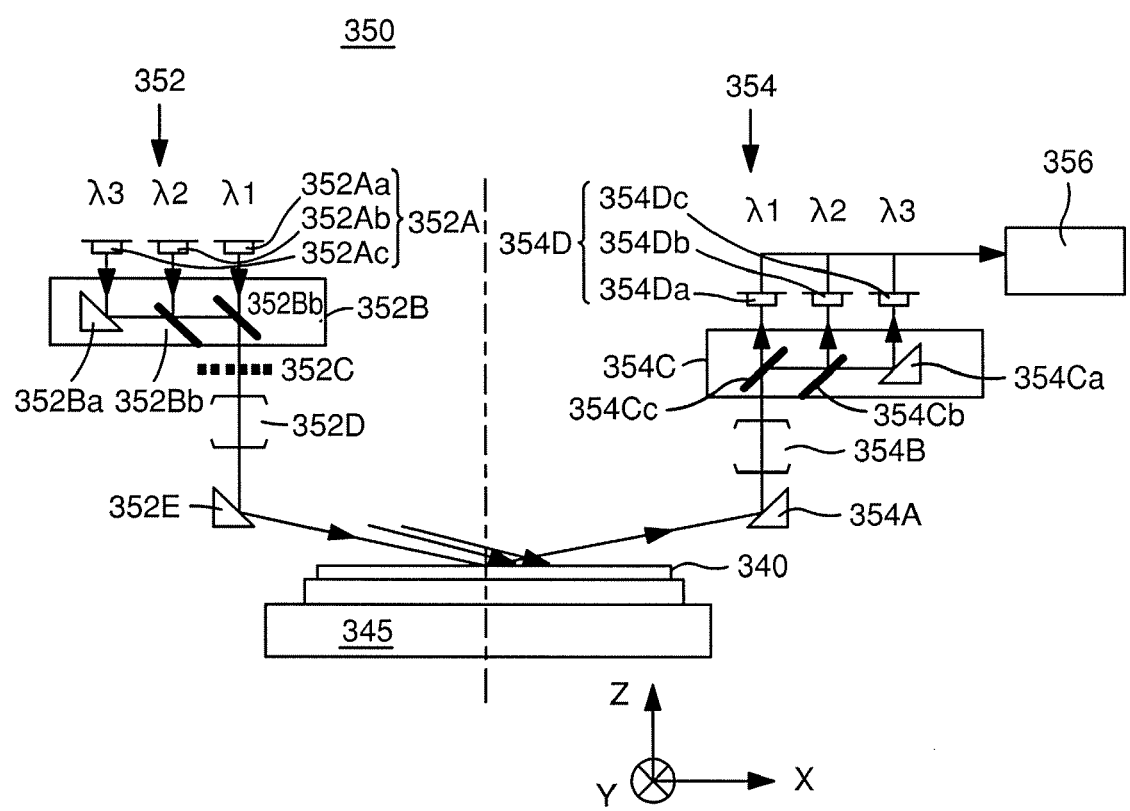
FIG. 28 is an enlarged block diagram showing a structure of a focus/tilt detecting system.

The focus/tilt detecting system 350 includes, as shown in FIG. 28, an illumination unit 352 for introducing the light to the surface of the wafer 340 at a high incident angle, a detector 354 for detecting an image offset of the reflected light that is reflected from the surface of the wafer 340, and an operation part 356. The illumination unit 352 includes a light source 354A, a light synthesizer means 352B, a pattern plate 352C, an imaging lens 352D, and a mirror 352E. The detector 354 includes a mirror 354A, a lens 354B, an optical demultiplexer means 354C, and a light receiving unit 354D. Here, FIG. 28 is an enlarged block diagram showing a structure of the focus/tilt detecting system 350. FIG. 28 omits from the illumination part 352 a lens unit necessary to illuminate the pattern plate 352C at the uniform light intensity distribution, and a lens unit for correcting the chromatic aberration.

Referring to FIG. 28, the lights having wavelengths $\lambda 1$, $\lambda 2$ and $\lambda 3$ emitted from the light sources 352Aa, 352Ab and 352Ac, such as an LED and a halogen lamp, pass the light synthesizer means 352B that includes a mirror 352Ba and dichroic mirrors 352Bb and 352Bc, and illuminates the pattern plate 352C, on which a pattern, such as a slit, is formed. The light that passes the pattern plate 315 images on the wafer 340 via the imaging lenses 352D and 352E.

The light reflected on the wafer 340 is received by the light receiving unit 354D that includes light receiving elements 354Da, 354Db and 354Dc, such as a CCD device and a line sensor. The optical demultiplexer means 354C is provided before the light receiving unit 354D, and includes the mirror 354Ca and dichroic mirrors 354Cb and 354Cc. The light demultiplexer means 354C serves to divide the lights having different wavelengths so that the light receiving element 354Da receives the light from the light source 352Aa, the light receiving element 354Db receives the light from the light source 352Ab, and the light receiving element 354Dc receives the light from the light source 352Ac. The pattern image on the pattern plate 352C of the wafer 340's surface re-images on the light receiving elements 354Da to 354Dc by the lens 354B.

As the wafer 340 moves in the longitudinal direction (or the Z-axis direction) via the wafer stage 345, the pattern image of the pattern plate 352C moves in the lateral direction (or the X-axis direction) on the light receiving unit 354D. Therefore, the focus tilt/detecting system 350 detects the surface position of the wafer 340 for each measuring point by using the operation part 356 to calculate the position of the pattern image.

Figure 29:
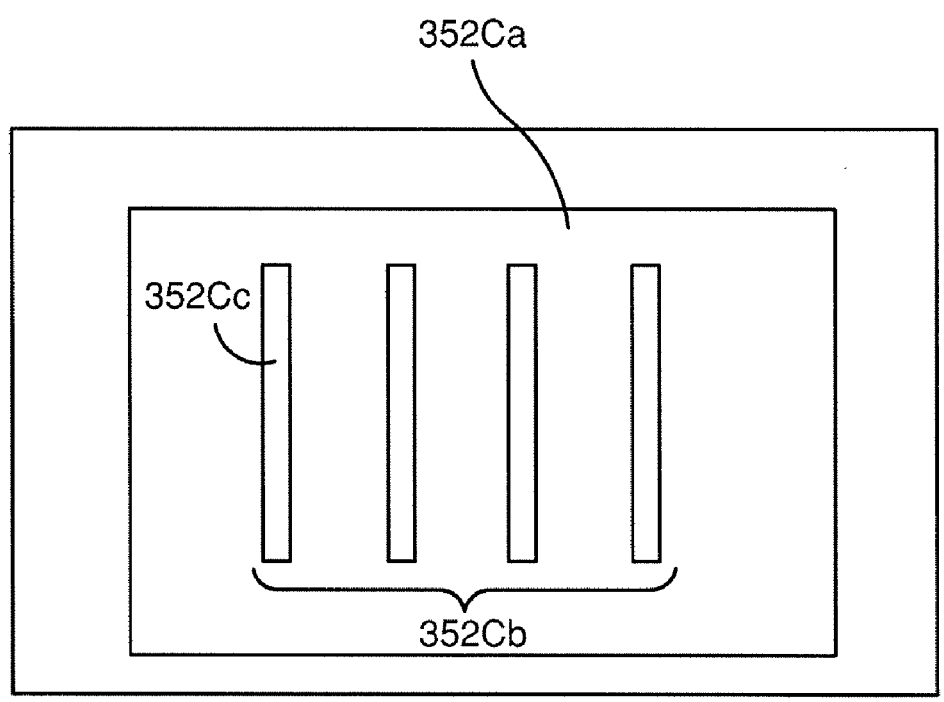
FIG. 29 is a plane view of one exemplary pattern plate shown in FIG. 28.

A description will now be given of a pattern on the pattern plate 352C and the signal waveform detected by the detector 354. FIG. 29 is a plane view of one example of the pattern plate 352C. Referring to FIG. 29, the pattern plate 352C has a grating pattern 352Cb that arranges four rectangular shielding patterns 352Cc on the transmission area 352Ca. FIG. 30 shows a waveform detected by the detector 354 when the grating pattern 352Cb of the pattern plate 352C is used. When the light receiving elements 354Da to 354Dc use a two-dimensional sensor, a signal waveform is obtained by integrating (or averaging) the light intensity in the direction perpendicular to the arranging direction of the shielding patterns 352Cc. When the light receiving elements 354Da to 354Dc use a one-dimensional line sensor, it is advantageous to use a cylindrical lens having a power in the direction perpendicular to the arranging direction of the shielding patterns 352Cc to obtain the signal waveform through the optical integration because S/N (i.e., a signal to noise ratio) of the signal waveform improves.

Figure 30A:
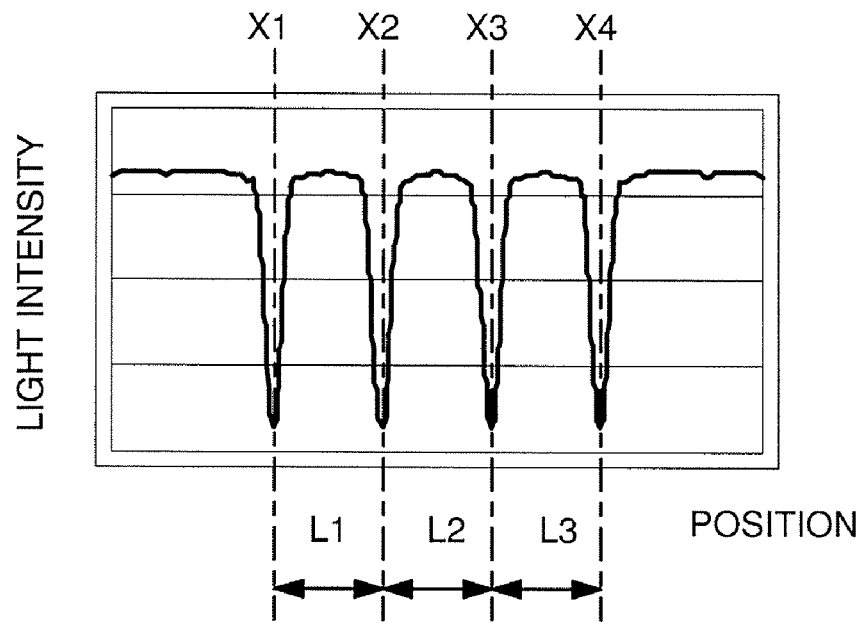
FIGS. 30A and 30B show a signal waveform detected by a detector shown in FIG. 28 when the pattern plate shown in FIG. 29 is used.
Figure 30B:
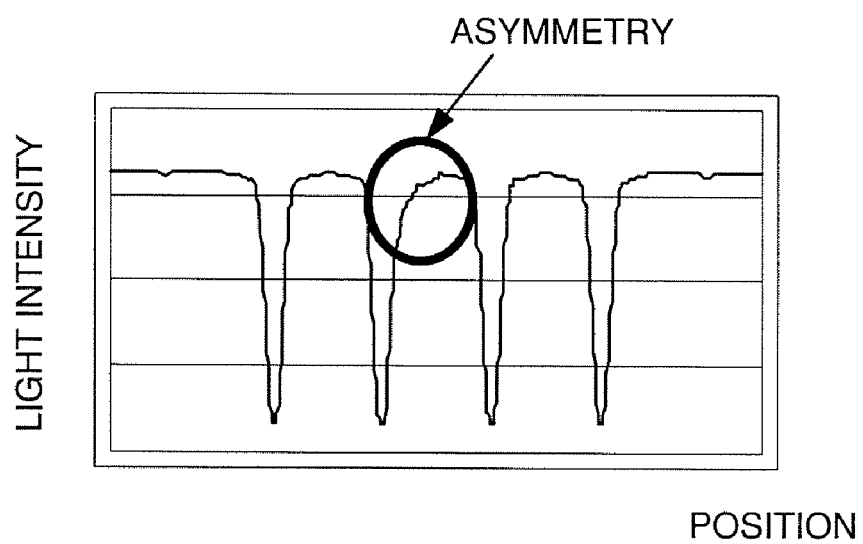

FIG. 30A shows an example of a signal waveform obtained from the light having the wavelength $\lambda 1$. FIG. 30B shows an example of a signal waveform obtained from the light having the wavelength $\lambda 3$. The signal waveform shown in FIG. 30A has a good symmetry of the image of the grating pattern 352Cb, whereas the waveform signal shown in FIG. 30B has a partial asymmetry. Therefore, it is understood that the waveform signal even at the same measuring point has dependency upon the light's wavelength.

Figure 31:
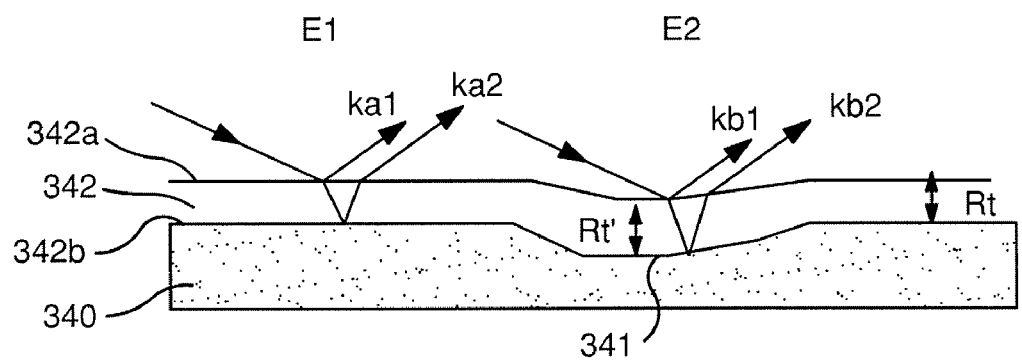
FIG. 31 is a view for explaining a reflectance difference resulting from an uneven coating thickness of a resist and the wafer's pattern step.
Figure 32:
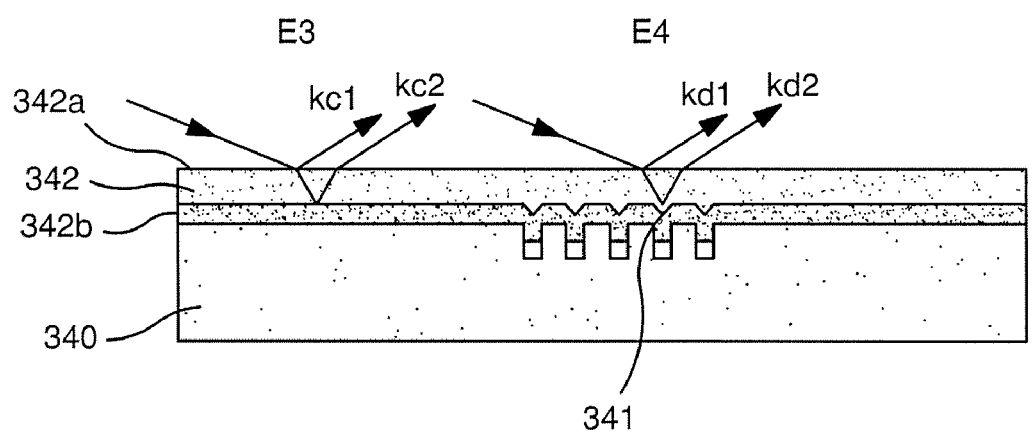
FIG. 32 is a view for explaining a reflectance difference between an area having a small step pattern density on a wafer and an area having a large step pattern density.
Figure 33:
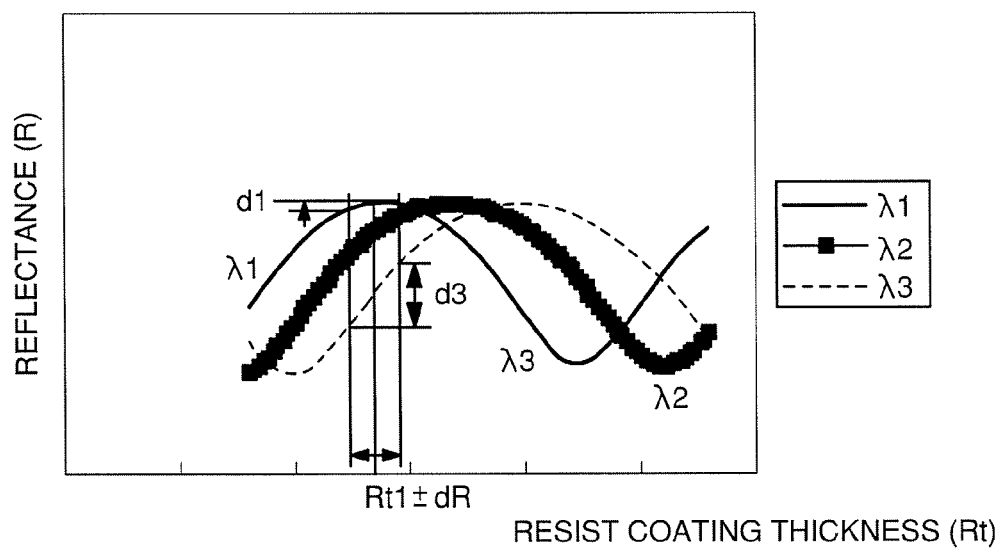
FIG. 33 is a graph showing a wavelength dependency of a reflectance of a wafer relative to the resist's coating thickness.

Referring to FIGS. 31 to 33, a description will be given of the dependency of the waveform signal detected by the detector 354 relative to the illumination light's wavelength. FIG. 31 is a view for explaining a difference of the reflectance caused by the uneven coating thickness of the resist 342 and the pattern step 341 on the wafer 340. The reflectance of the wafer 340 to which the resist 342 is applied is determined by the interference between the reflected light from the resist front surface 342a and the reflected light from the resist back surface 342b (or an interface between the wafer 3.40 and the resist 342). On the wafer 340, a coating thickness Rt' of the resist 342 in an area E2 having a pattern step 341 is larger than a coating thickness Rt of the resist 342 in an area E1 having no pattern step 341. Therefore, an optical-path length dA between the reflected light ka1 of the light irradiated onto the area E1 at the resist front surface 342a and reflected light ka2 of the light irradiated onto the area E1 at the resist back surface 342b is different from an optical-path length dB between the reflected light kb1 of the light irradiated onto the area E2 at the resist front surface 342a and reflected light kb2 of the light irradiated onto the area E2 at the resist back surface 342b. Therefore, the areas E1 and E2 have a difference in reflectance. When the light is irradiated onto the areas having differences in reflectance, the asymmetric signal waveform occurs as shown in FIG. 30B.

Causes of the difference of reflectance that occurs on the wafer 340 are not limited simply to the non-uniformity of the coating thickness of the resist, as shown in FIG. 31, but cover other reasons. FIG. 32 is a view for explaining a difference of the reflectance between an area E3 having a small density of the step pattern 341 (or no step pattern 341) on the wafer 341 and an area E4 having a large density of the step pattern 341.

Referring to FIG. 32, the resist 342 has the same coating thickness between the areas E3 and E4, and the reflected lights kc1 and kd1 have approximately the same reflectance on the resist front surface 342a. However, the areas E3 and E4 have different densities of the step pattern 341 on the wafer 340, and the reflected light kc2 and kd2 have different reflectances at the resist back surface 342b (or the interface between the wafer 340 and the resist 342). Moreover, when the step pattern 341 on the wafer 340 is smaller than a wavelength of the illumination light, a phase jump due to a reflection called a structural birefringence, and a difference of reflectance occurs because a phase difference occurs between the reflected lights kc2 and kd2 at the resist back surface 342b.

In this way, the difference of the reflectance occurs due to the step pattern 341 (or the coating thickness of the resist 342) on the wafer 340, but the difference of the reflectance occurs due to a difference of a wavelength of the illumination light.

FIG. 33 is a graph showing a wavelength dependency of a reflectance of the wafer 340 relative to the resist 342's coating thickness. Suppose that the resist 342's coating thickness changes from Rt1 to Rt1±dR. The reflectance varies only by d1 for the wavelength $\lambda 1$ of the illumination light, whereas the reflectance varies by d3 for the wavelength $\lambda 3$ of the illumination light. Even when the resist 342's coating thickness equally varies, the changing amount of the signal waveform for the reflectance of the wavelength $\lambda 1$ and its measuring precision improves, since the changing amount of the reflectance of the wavelength $\lambda 1$ is smaller than that of the reflectance of the wavelength $\lambda 3$. In other words, the measuring accuracy of the focus/tilt detecting system 350 varies according to a wavelength of the illumination light.

Figure 34:
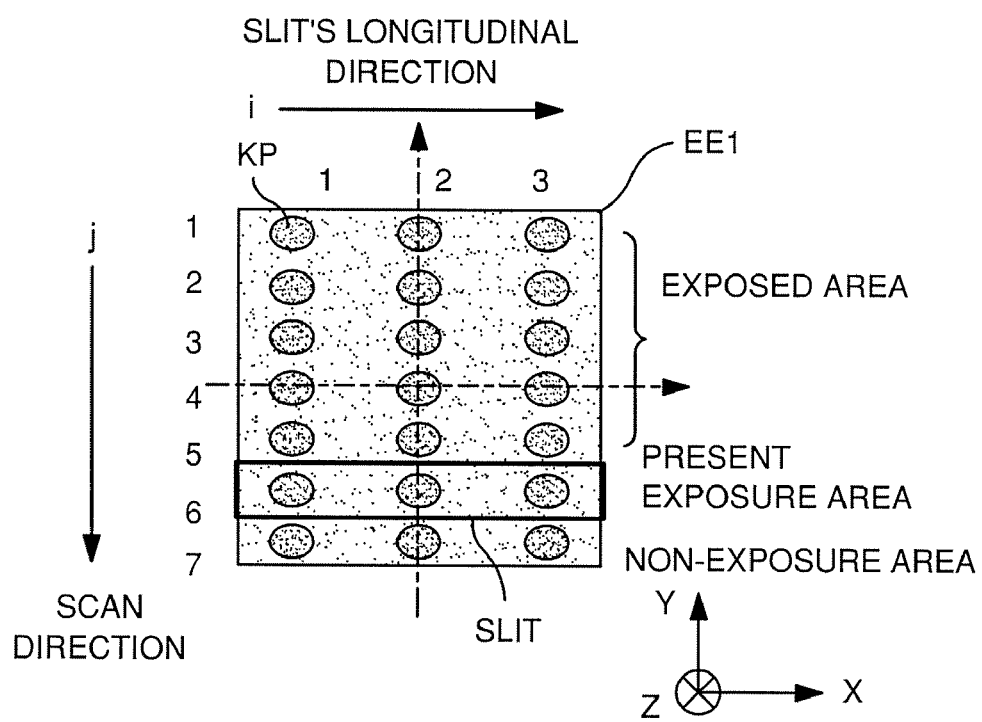
FIG. 34 is a plane view showing one exemplary arrangement of measuring points on the wafer.

A description will be given of the measuring points of the surface position (focus) of the wafer 340. This embodiment provides totally twenty-one measuring points KP, i.e., seven points in the scan direction and three points in a direction perpendicular to the scan direction (or slit longitudinal direction) for an exposure area EE1 for one shot as shown in FIG. 34. This embodiment arranges three focus/tilt detecting systems 350 in the slit longitudinal direction (or X-axis direction) for measurements of three measuring points KP in the slit longitudinal direction, and scans the wafer stage 345 in the X-axis direction for measurements of seven measuring points in the scan direction (or Y-axis direction). FIG. 34 is a plane view of one example of an arrangement of the measuring points KP on the wafer 340.

Figure 35:
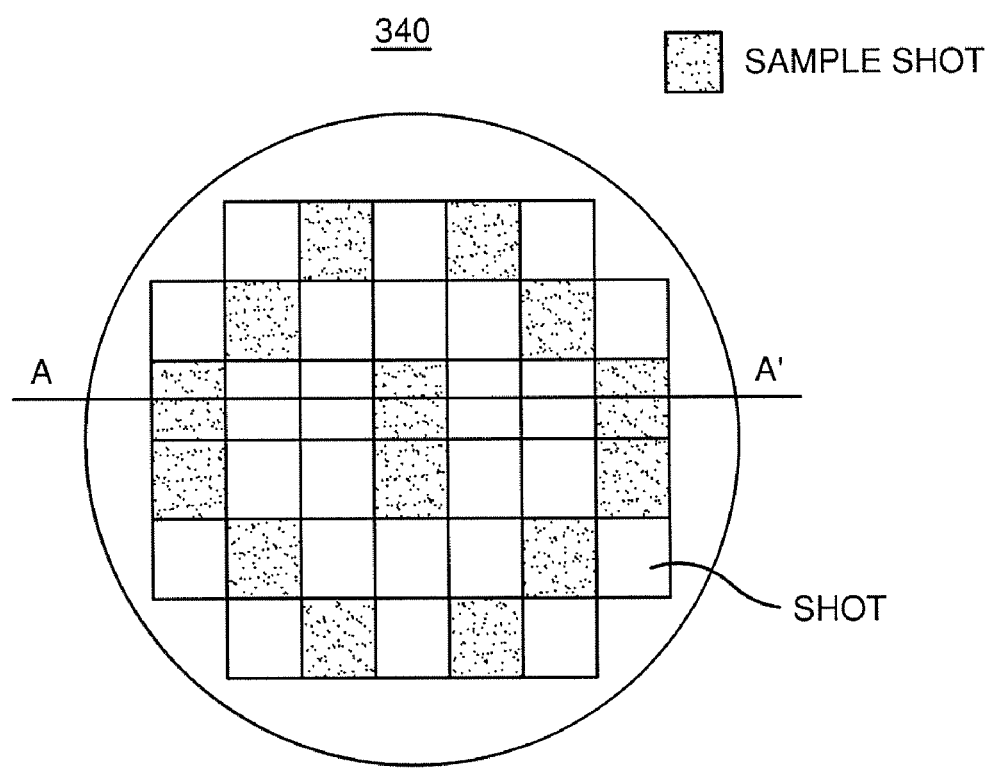
FIG. 35 is a plane view showing a shot layout on the wafer.
Figure 36:
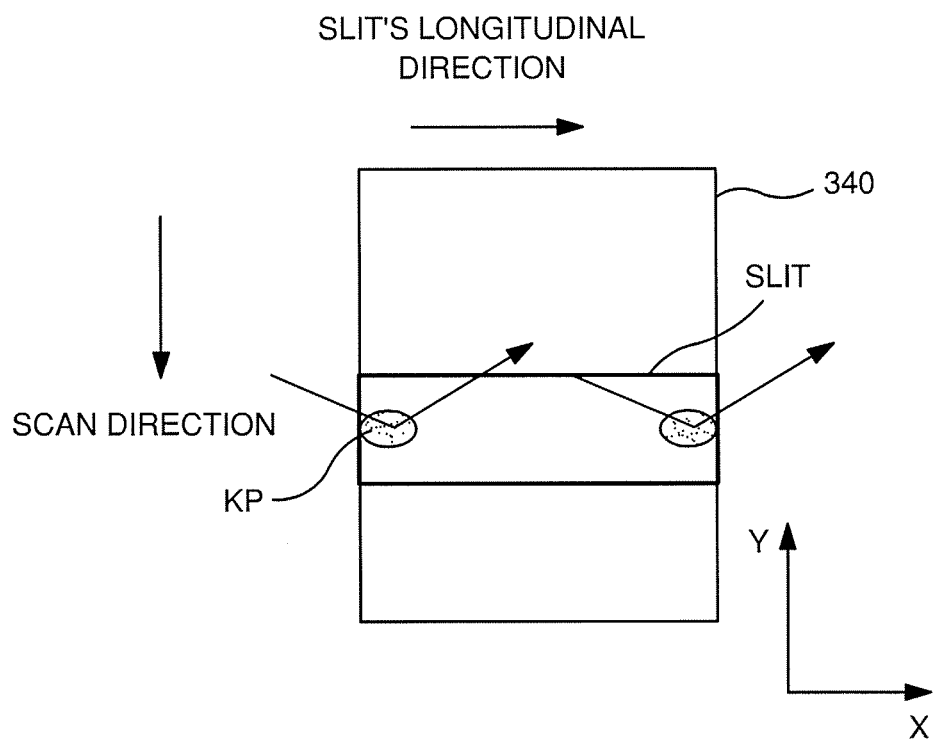
FIG. 36 is a plane view showing one exemplary arrangement of measuring points in a slit of the wafer.
Figure 37:
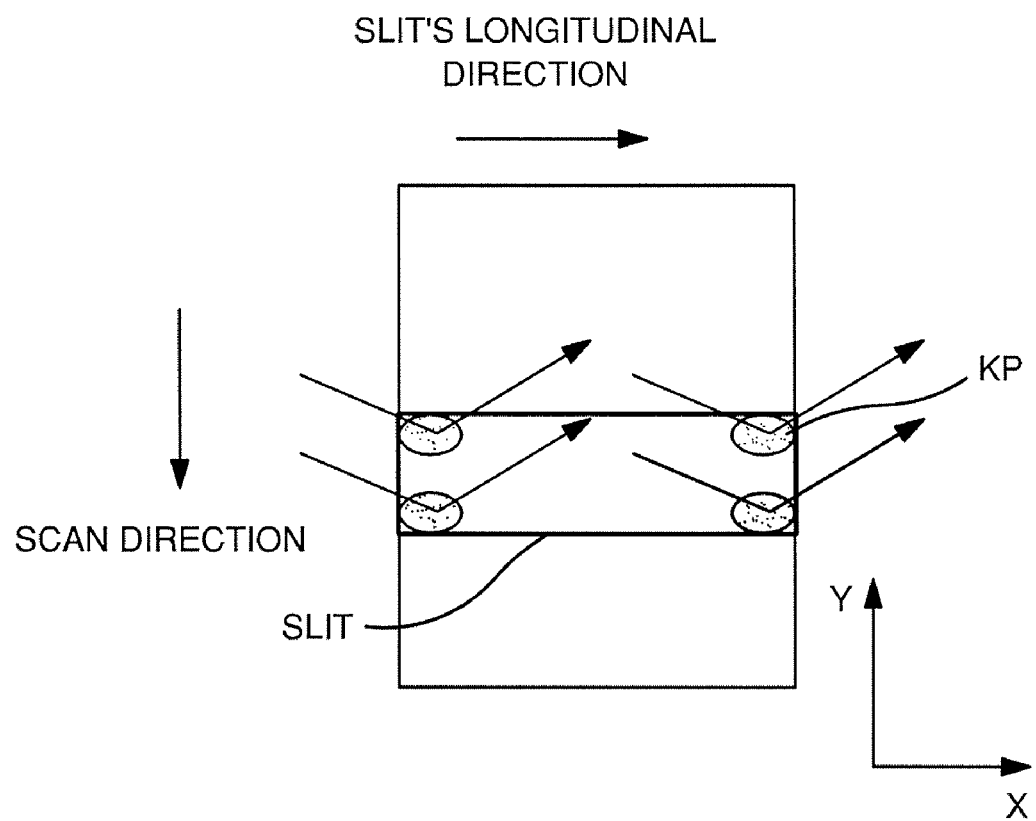
FIG. 37 is a plane view showing one exemplary arrangement of measuring points in a slit of the wafer.

As shown in FIG. 35, since plural shots are exposed on the wafer 340, the wafer stage 345 is stepped and scanned for each shot and twenty-one measuring points KP shown in FIG. 34 are measured. Two or more measuring points KP are needed, because it is essential for the measuring points KP in the slit longitudinal direction to calculate the tilt amount $\omega y$ of the wafer 340 in the slit longitudinal direction as shown in FIG. 36. Moreover, when the tilt amount $\omega x$ of the wafer 340 in the scan direction in the slit, the measuring points KP that are differently located in the scan direction in the slit and a corresponding focus/tilt detecting system 350 should be provided as shown in FIG. 37. Here, FIG. 35 is a plane view showing a shot layout on the wafer 340. FIGS. 36 and 37 are plane views showing one exemplary arrangement of measuring points in slits of the wafer 340.

Figure 38:
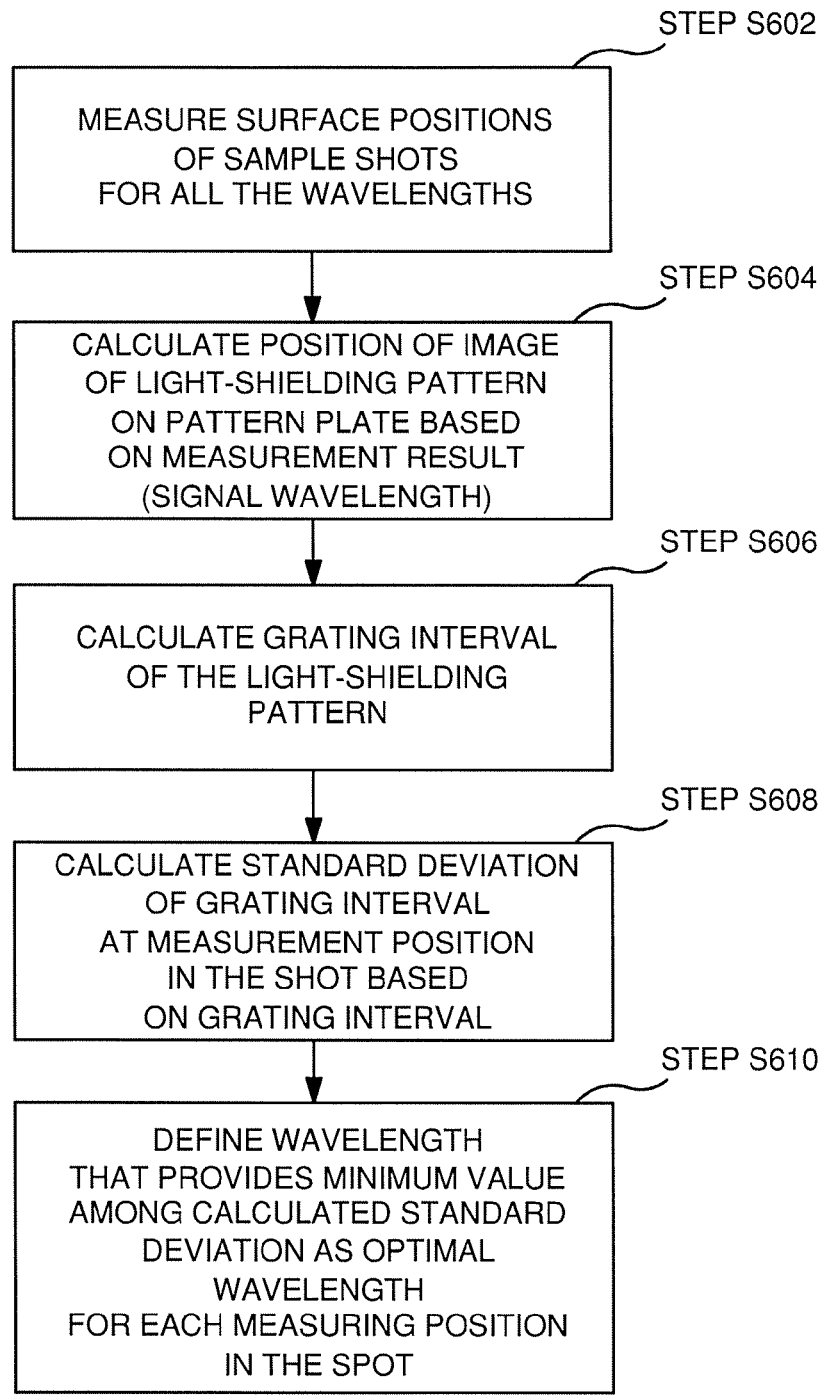
FIG. 38 is a flowchart for explaining an optimal wavelength selecting method of light irradiated by the focus/tilt detecting system.

A description will be given of a method for selecting an optimal wavelength of light that illuminates the measuring points KP by the focus/tilt detecting system 350. FIG. 38 is a flowchart for explaining an optimal wavelength selecting method of light irradiated by the focus/tilt detecting system 350.

Referring to FIG. 38, surface positions of all the fourteen sample shots are measured with lights having all the different wavelengths possessed by the focus/tilt detecting system in the shot layout on the wafer 340 shown in FIG. 35 (step S602). Next, positions x1, x2, x3 and x4 (see FIG. 30A) of images of the four shielding patterns 352Cc on the pattern plate 352 are calculated based on the signal waveform measured by the focus/tilt detecting system 350 (step S604), and grating intervals L1, L2 and L3 (see FIG. 30A) of the shielding pattern 352Cc are calculated (step S606). The grating intervals Lseij($\lambda$) are calculated for all the wavelengths of lights and all the measuring points KP. Here, the suffix "s" is a sample shot number and S=1 to 14. The suffix "e" is an interval number and e=1 to 3. The suffix "i" is an in-shot measuring position number in a slit longitudinal direction, and i=1 to 3. The suffix "j" is an in-shot measuring position number in a scan direction, and j=1 to 7. $\lambda$ is a wavelength of the illumination light, and $\lambda=\lambda 1$ to $\lambda 3$.

Next, the standard deviation $\sigma Lij(\lambda)$ of the grating intervals at measuring positions (i, j) is calculated based on the grating intervals Lseij($\lambda$) (step S608). The wavelength $\lambda$ that minimizes the calculated standard deviation $\sigma Lij(\lambda)$ is calculated, and this wavelength $\lambda$ is defined as the optimal wavelength $\lambda opt(i, j)$ of each measuring position (i, j) in the shot (step S610).

The reason why the wavelength $\lambda$ that minimizes the calculated standard deviation $\sigma Lij(\lambda)$ is defined as the optimal wavelength $\lambda opt(i, j)$ of each measuring position (i, j) in the shot is that the coating thickness of the resist 342 changes among shots on the wafer 340 due to the step pattern 341 and the resist 342's uneven application, and thus the measurement precision improves as the reproducibility of the grating intervals Lseij($\lambda$) among shots improves.

After the optimal wavelength $\lambda opt(i, j)$ is selected, an average value Xa(i, j) of the positions x1 to x4 of the images of four shielding patterns 352Cc are calculated from the signal waveforms of the pattern plate 352C illuminated by the optimal wavelength $\lambda opt(i, j)$ and the surface position of the wafer 340 are measured.

The number of sample shots used to select the optimal wavelength is not limited to fourteen, and all the shots on the wafer may be used for measurements. The number of wafer to be measured is not limited to one; the optimization precision of the wavelength improves as several wafers are measured and the denominator of the grating intervals Lseij ($\lambda$) increases. While the instant embodiment forms the pattern plate 352C so that the grating pattern 352Cb does not transmit the light, the entire surface of the pattern plate 352C is made as a shielding part and only the grating pattern 352C may transmit the light.

Figure 39:
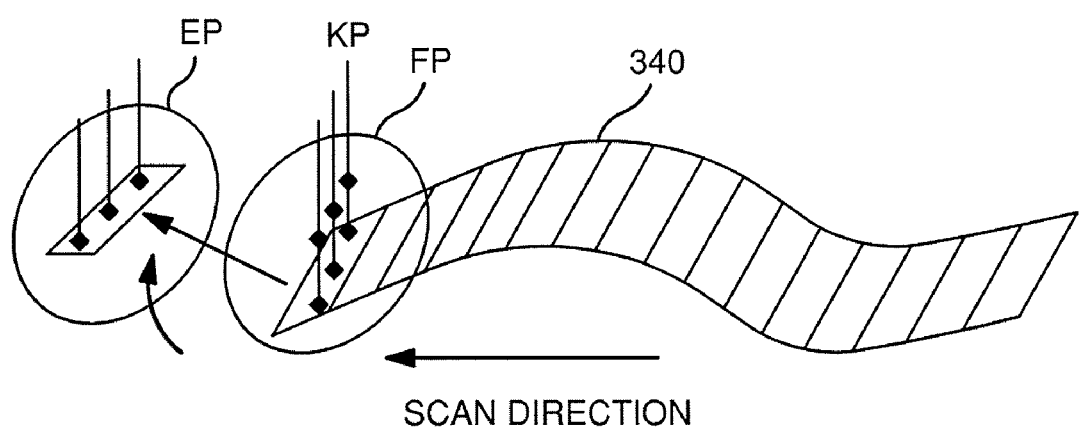
FIG. 39 is a schematic perspective view showing an exposure area, and focus and tilt measuring positions on the wafer.

A description will now be given of the overview of the surface position correction of the wafer 340 by the focus and tilt measurements during the scan exposure. As shown in FIG. 39, before the conveoconcave wafer 340 reaches the exposure position EP in the scan direction, the focuses and the tilts (referred to as "tilt X" hereinafter) in the exposure slit area longitudinal direction (or a direction perpendicular to the scan direction) of the surface positions of the wafer 340 plural measuring positions KP (or measuring position FP) that area arranged so that these measuring points form a plane ahead of the exposure slits the wafer stage 345 is driven to the exposure position EP for corrective driving based on the positional information detected by the focus/tilt detecting system 350. For example, in FIG. 28, a measurement of the surface position of j=7 is measured while a position j=6 on the wafer 340 is being exposed. After the exposure to the position j =6 ends, the position of j=7 is exposed based on the measurement result of the surface position of j=7, with corrective driving of the focus and tilt X. Here, FIG. 39 is a schematic perspective view showing an exposure area EP and the focus and tilt measuring positions FP on the wafer 340.

Figure 40:
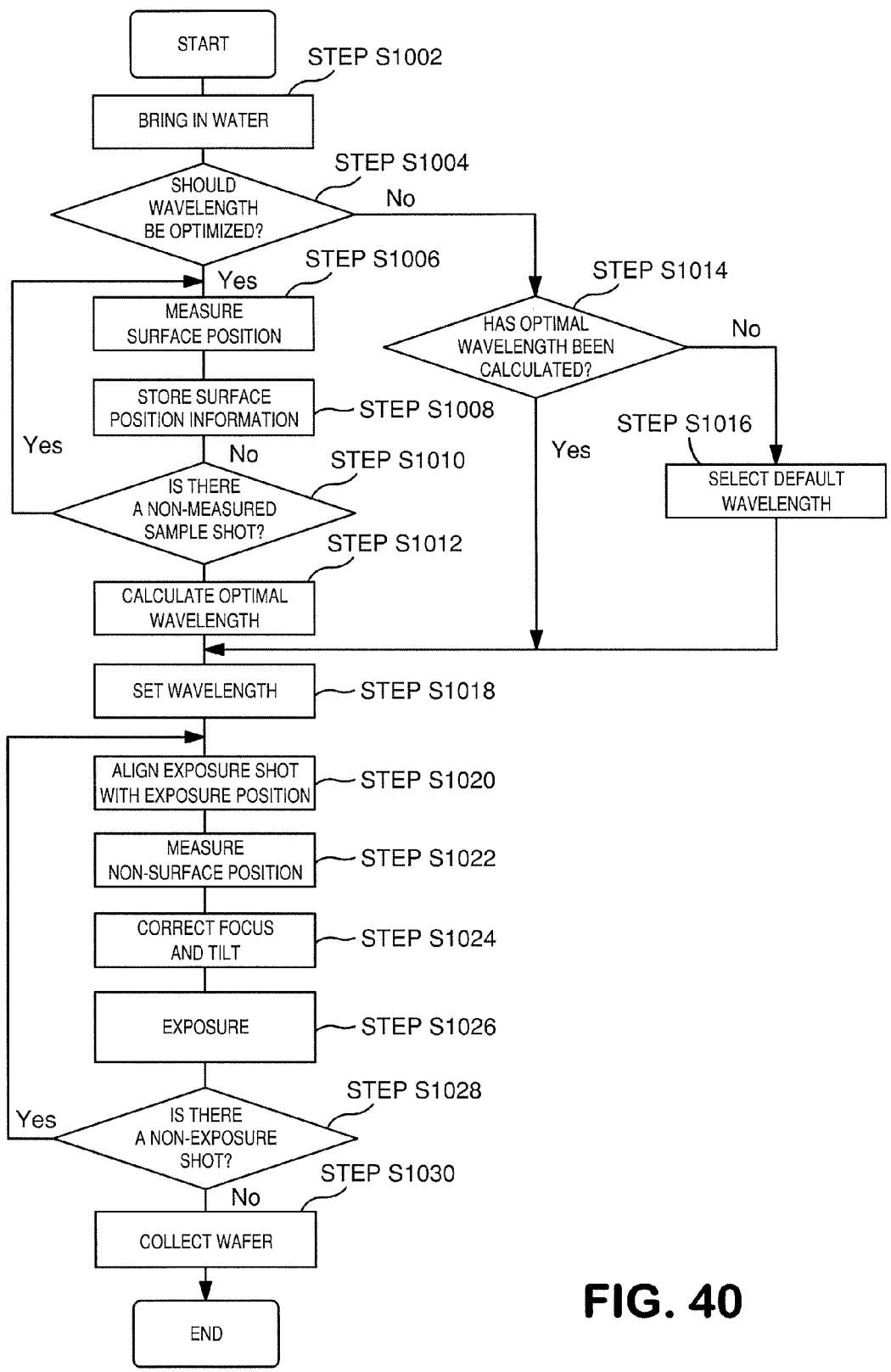
FIG. 40 is a flowchart for explaining an exposure method using the exposure apparatus shown in FIG. 27.

FIG. 40 is a flowchart for explaining an exposure method using the exposure apparatus 301. Referring to FIG. 40, the wafer 340 supplied to the exposure apparatus 301 (step S1002), and the focus/tilt detecting system 350 determines whether the wavelength of the light for illuminating the measuring positions KP should be optimized (step S1004). Whether the wavelength is optimized is previously registered in the exposure apparatus 301.

If the optimization of the wavelength is necessary, the surface positions are measured with respect to the sample shots shown in FIG. 35 for all the wavelengths of the lights which the focus/tilt detecting system 350 can use (step S1006), and the surface position information is stored (step S1008). Whether there is an unmeasured sample shot is then determined (step S1010). If there is, measurements of surface positions of the unmeasured sample shots and the storage of the surface position information continue until there is no unmeasured sample shot.

When the measurements of surface positions of the unmeasured sample shots and the storage of the surface position information end (or when there is no unmeasured sample shot), the optimal wavelength $\lambda \text{opt}(i, j)$ is calculated for each measuring point KP in the shot based on the surface position information of each sample shot stored in the step S1008 (step S1012).

On the other hand, when the optimization of the wavelength is unnecessary, it is determined whether the optimal wavelength of the light used by the focus/tilt detecting system 350 to illuminate the measuring point KP is calculated (step S1004). For example, whether the optimal wavelength $\lambda \text{opt}(i, j)$ is calculated is determined based on the prior wafer. When the optimal wavelength $\lambda \text{opt}(i, j)$ is calculated r the procedure moves to step S1018. When the optimal wavelength $\lambda \text{opt}(i, j)$ has not yet been calculated, the same default wavelength (for example, $\lambda 1$) is selected for all the measuring points KP (step 1016), and the procedure moves to step S1018.

The step S1018 sets the wavelength of the light used by the focus/tilt detecting system 350 to illuminate the measuring point KP to the optimal wavelength $\lambda \text{opt}(i, j)$ or the default wavelength. Thereafter, the exposure shot is set to the exposure position by driving the wafer stage 345 (step S1020), and the surface positions by the focus/tilt detecting system 350 are measured for the exposure shot by using the optimal wavelength $\lambda \text{opt}(i, j)$ or the default wavelength (step S1022).

Next, the wafer 340 is driven based on the surface position measured in step S1022, the focus and tilt are corrected (step S1024), and the pattern on the reticle 320 is exposed onto the wafer 340 (step S1026). It is then determined whether there is a shot to be exposed (or unexposed shot) (step S1028), and the procedure up to step S1020 repeats until there is no unexposed shot. When all the shots are exposed, the wafer 340 is collected (step S1030) and the procedure ends.

The exposure method using the exposure apparatus 301 realizes high focus correction accuracy, and improves the resolution and yield even if the DOF is small.

It is an effective optimization of the wavelength of the light used by the focus/tilt detecting system 350 to illuminate the measuring positions KP that the optimal wavelength is defined as a wavelength that provides a sufficiently symmetrical signal waveform detected by the focus/tilt detecting system 350. For example, in illuminating the device pattern that includes, on the wafer 340, a repetitive pattern similar to the grating pattern 352Cb of the pattern plate 352C shown in FIG. 29, the signal waveforms of all the grating patterns 352Cb deform similarly and the grating intervals L1, L2 and L3 do not scatter relative to any wavelengths. In this case, the inventive effect is obtained by selecting a wavelength that provides a sufficiently symmetrical waveform as an optimal wavelength.

Figure 41:
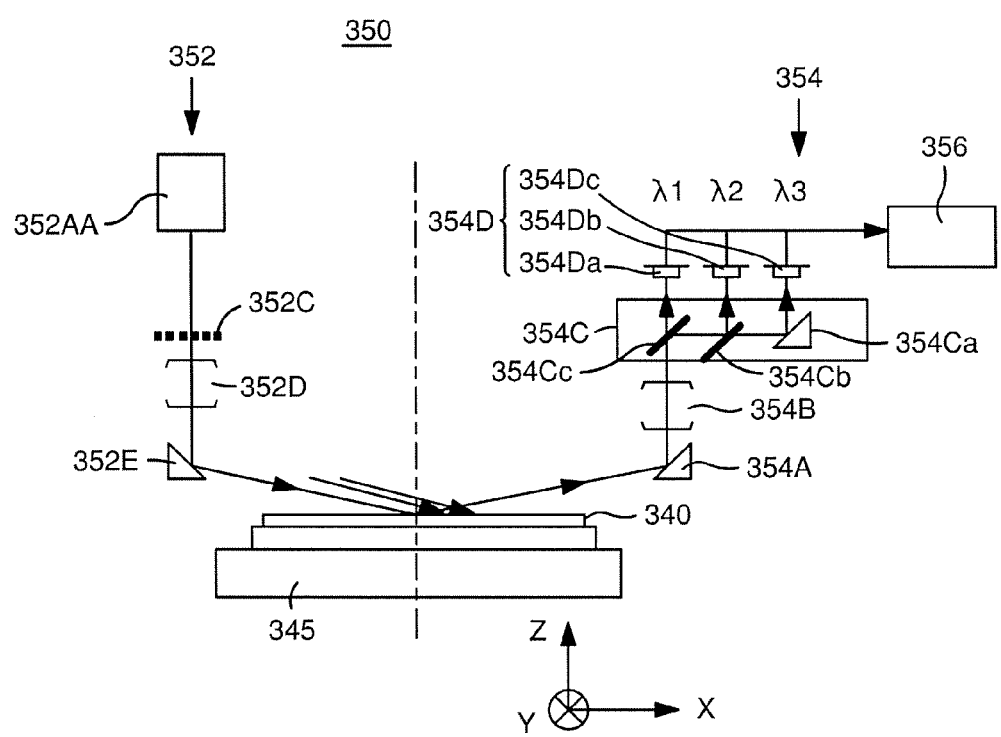
FIG. 41 is a block diagram showing a structure of a variation of the focus/tilt detecting system shown in FIG. 28.

As shown in FIG. 41, the light source 352A can be replaced with a broadband light source 352AA, such as a halogen lamp. The broadband light source 352AA enables the waveform signal for each wavelength to be detected, when the dichroic mirrors 354Cb and 354Cc in the detector 354 enable the light receiving elements 354Da, 354Db and 354Dc to receive the lights having central wavelengths $\lambda 1$, $\lambda 2$ and $\lambda 3$. Here, FIG. 41 is a block diagram showing a structure of a variation of the focus/tilt detecting system 350.

Figure 42:
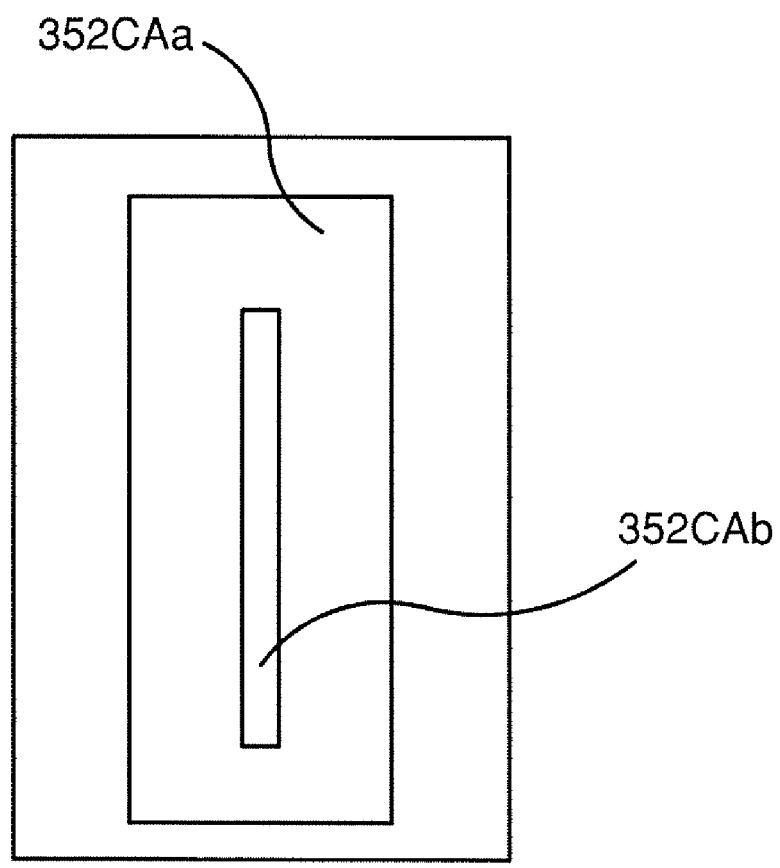
FIG. 42 is a plane view showing a pattern plate as a variation of the pattern plate shown in FIG. 29.

A description will now be given of a method for selecting the optimal wavelength of light for illuminating the measuring points KP when the pattern plate 352CA shown in FIG. 42 is used instead of the pattern 352C for the focus/tilt detecting system 350. FIG. 42 is a plane view showing the pattern plate 352CA as a variation of the pattern plate 352C.

Referring to FIG. 42, the pattern plate 352CA has one rectangular pattern 352CAb as a light shielding part on a transmission area 352CAa as a light transmitting part. Since the pattern plate 352CA has a smaller projected image area on the wafer 340 than the pattern plate 352C, the surface positions on the wafer 340 can be measured at finer pitches. On the other hand, since the grating interval of the rectangular pattern 352CAb cannot be measured, another method is necessary for selecting the optimal wavelength of the light for illuminating the measuring points KP, which is different from the above method.

Figure 43:
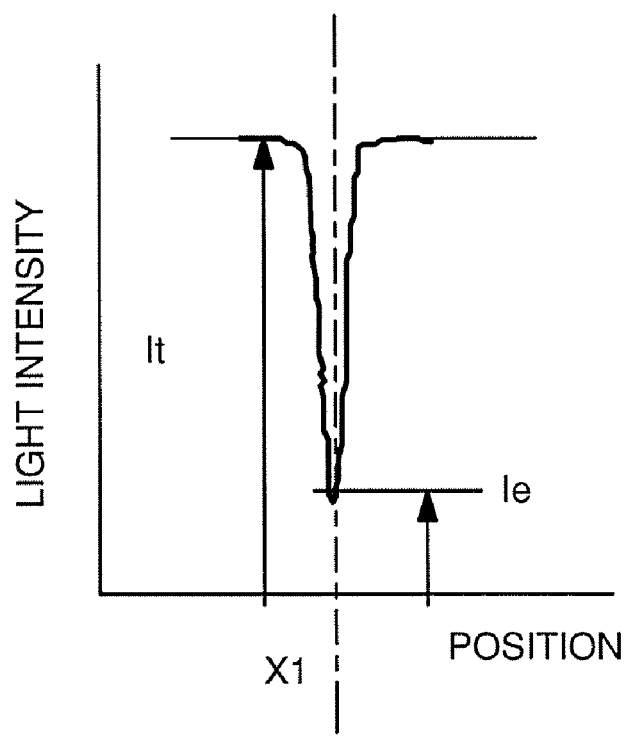
FIG. 43 is a flowchart for explaining an optimal wavelength selecting method of light irradiated by the focus/tilt detecting system when the pattern plate shown in FIG. 42 is used.
Figure 44:
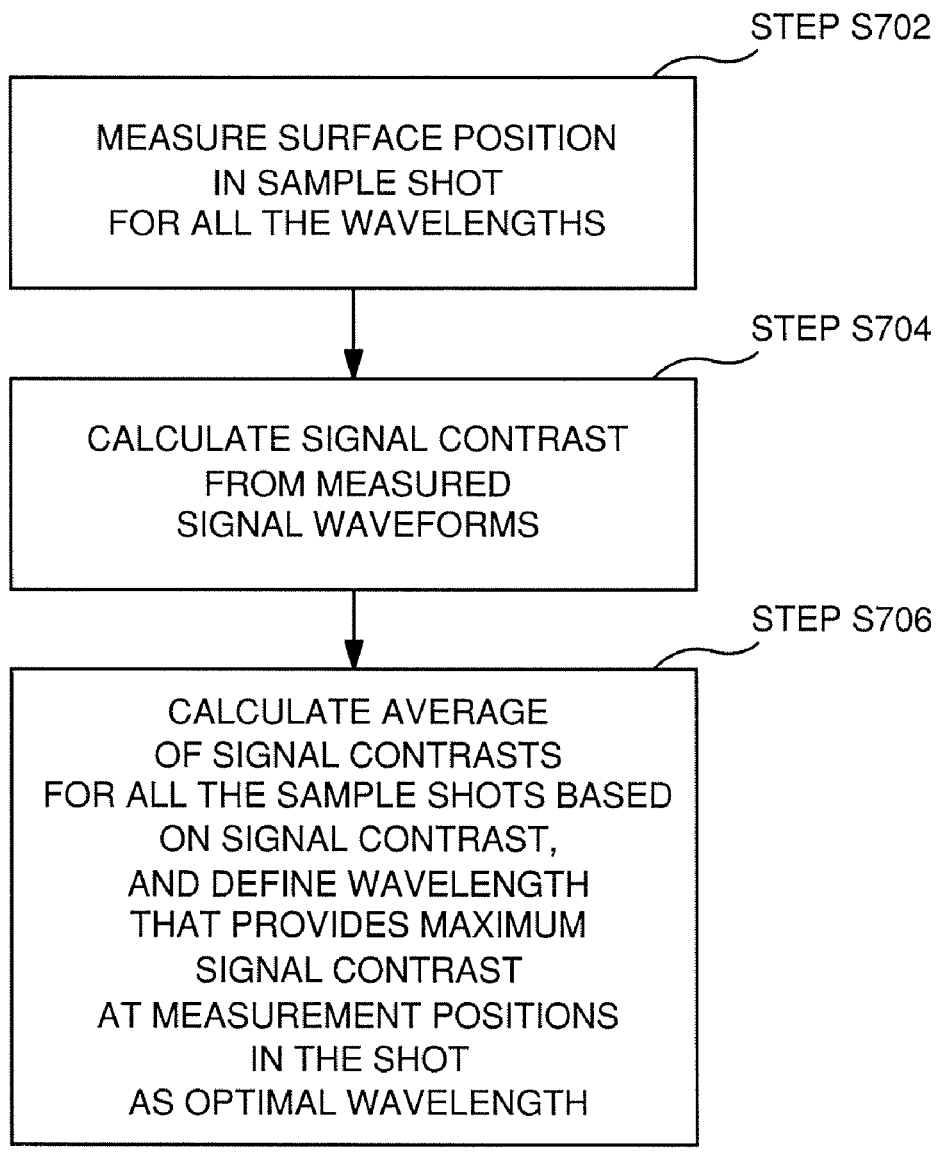
FIG. 44 is a signal waveform diagram detected by the detector shown in FIG. 28 when the pattern plate shown in FIG. 42 is used.

FIG. 43 is a flowchart for explaining an optimal wavelength selecting method of light irradiated by the focus/tilt detecting system 350 when the pattern plate 352CA is used. First, surface positions of all the fourteen sample shots are measured with lights having all the different wavelengths possessed by the focus/tilt detecting system in the shot layout on the wafer 340 shown in FIG. 35 and a signal waveform is obtained (step S702) FIG. 44 shows one exemplary signal waveform detected by the detector 354 when the rectangular pattern 352CAb of the pattern plate 352CA is used.

Next, the signal contrast $C=(It-Ie)/(It+Ie)$ is calculated based on the signal waveform measured by the focus/tilt detecting system 350, where "It" is the light intensity of the transmitting area 352CAa of the pattern plate 352CA and "Ie" is the light intensity of the rectangular pattern 352CAb (step S704) The signal contrast $Csij(\lambda)$ are calculated for all the wavelengths of lights and all the measuring points KP. Here, the suffix "s" is a sample shot number and S=1 to 14. The suffix "i" is an in-shot measuring position number in a slit longitudinal direction, and i=1 to 3. The suffix "j" is an in-shot measuring position number in a scan direction, and j=1 to 7. $\lambda$ is a wavelength of the illumination light, and $\lambda=\lambda 1$ to $\lambda 3$.

Next, an average of the signal contrasts for all the sample shots is calculated based on the signal contrast $Csij(\lambda)$, and the wavelength $\lambda$ that maximizes the signal contrast in the measuring positions (i, j) is defined as the optimal wavelength $\lambda \text{opt}(i, j)$ of each measuring position (i, j) in the shot (step S706). Since the light intensity It corresponding to the transmitting area 352CAa of the pattern plate 352CA depends upon the reflectance of the wafer 340 surface, the signal contrast C becomes large as the reflectance becomes high. As shown in FIG. 33, the signal waveform that provides a higher reflectance on the wafer 340 causes smaller fluctuations of the reflectance to the coating thickness variance of the resist 342, reduces influence of distortion of the signal waveform, and provides good measurement reproducibility.

After the optimal wavelength λopt(i, j) is selected, the position X1 of the image of the rectangular pattern 352CAb is calculated from the signal waveform of the pattern plate 352CA illuminated by the optimal wavelength λopt (i, j), and the surface positions of the wafer 340 are measured.

A wavelength that maximizes the reflectance of the light that passes the transmitting area 352CAa of the pattern plate 352CA may be defined as the optimal wavelength instead of defining the maximum value of the signal contrast ratio as the optima wavelength. In this case, in order to calculate the reflectance, the incident intensity of the illumination light is necessary. Therefore, the reference mark table whose spectral reflectance Rref(λ) relative to the illumination light's wavelength is known is installed on the wafer stage, and the area that has no pattern on the reference mark table is measured by the focus/tilt detecting system 350, and the signal intensity Iref(λ) of the transmitting area 352CAa of the pattern plate 352CA is previously measured.

The reflectance R(λ) at each measuring point KP is calculated by R(λ)=Isin(λ)×Rref(λ)/Iref(λ), where Isin(λ) is the signal intensity of the transmitting area 352CAa when the surface positions are measured on the wafer 340.

The reflectance Rsij (λ) is calculated for all the wavelengths of lights and all the measuring points KP. Here, the suffix "s" is a sample shot number and S=1 to 14. The suffix "i" is an in-shot measuring position number in a slit longitudinal direction, and i=1 to 3. The suffix "j" is an in-shot measuring position number in a scan direction, and j=1 to 7. λ is a wavelength of the illumination light, and λ=λ1 to λ3.

The optimal wavelength λopt(i, j) of each measuring position (i, j) in the shot may be determined by calculating an average of all the sample shots based on the reflectance Rsij (λ).

Figure 45:
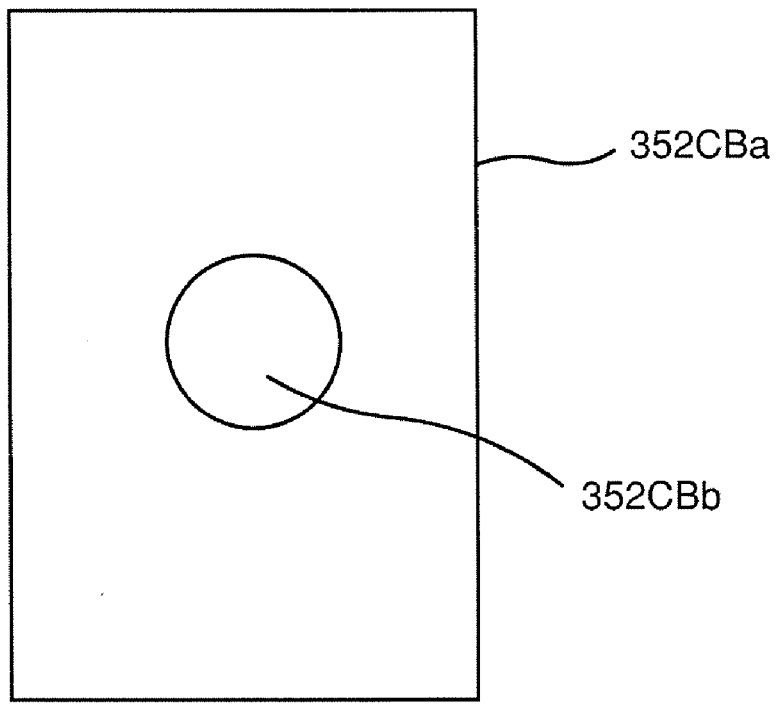
FIG. 45 is a plane view showing a pattern plate as a variation of the pattern plate shown in FIG. 42.
Figure 46A:
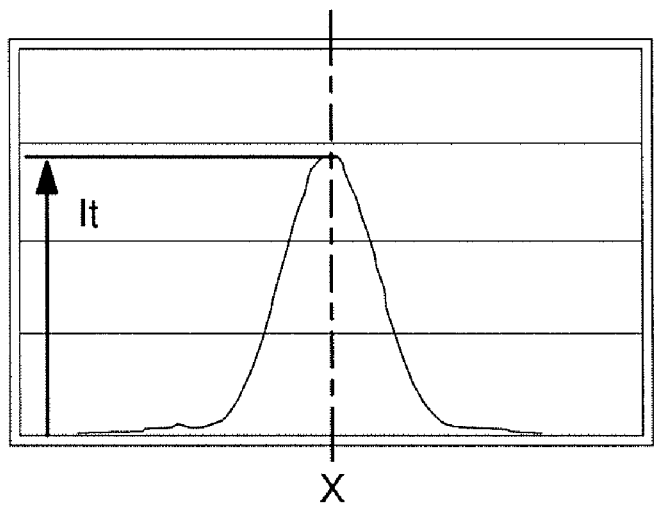
FIGS. 46A and 46B are a signal waveform diagram detected by the detector shown in FIG. 28 when the pattern plate shown in FIG. 45 is used.
Figure 46B:
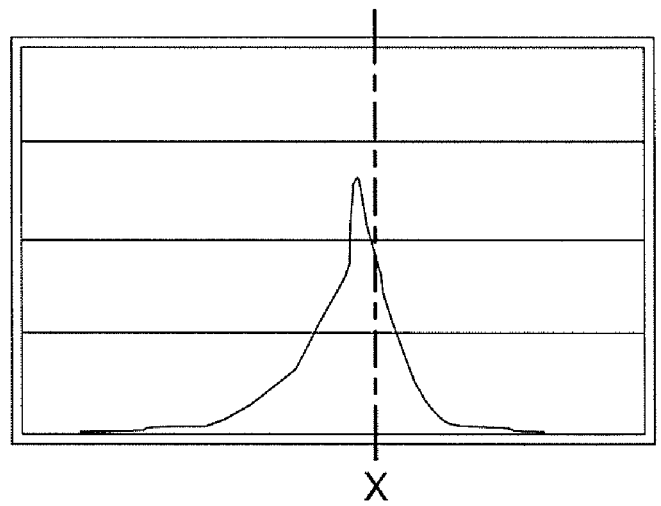

The pattern plate 352CA may be replaced with a pattern plate 352CB having a circular opening 352CBb in a light shielding area 352Cba as shown in FIG. 45. FIGS. 46A and 46B show a signal waveform detected by the detector 354 in the focus/tilt detecting system 350 when the opening 352CBb of the pattern plate 352CB is used. FIG. 46A shows a sufficiently symmetric signal waveform, whereas FIG. 46B shows an asymmetric signal waveform. Here, FIG. 45 is a plane view showing the pattern plate 352CB as a variation of the pattern plate 352CA.

Instead of using the pattern plate 352CA or 352CB, an alternative embodiment arranges an LED's exit part at a position conjugate with the wafer 340, projects the light emitted from the LED's exit part onto the wafer 340, and receives a projected image through a sensor.

Figure 47:
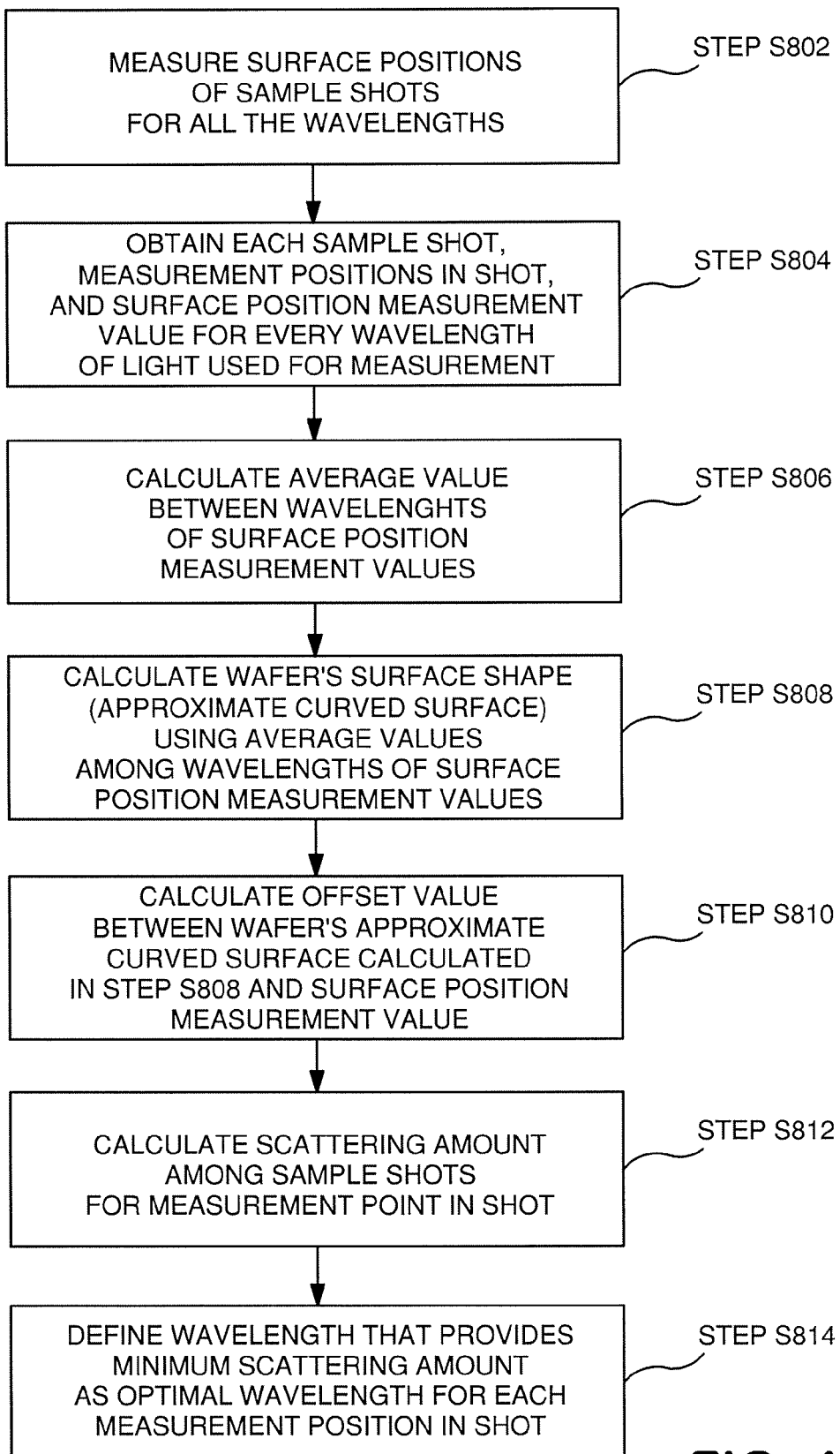
FIG. 47 is a flowchart for explaining an optimal wavelength selecting method of light irradiated by the focus/tilt detecting system.

Referring now to FIG. 47, a description will be given of a selecting method different from the optimal wavelength selecting method shown in FIG. 38. Here, FIG. 47 is a flowchart for explaining the optimal wavelength selecting method of the light irradiated by the focus/tilt detecting system 350.

Surface positions of all the fourteen sample shots are measured with lights having all the different wavelengths possessed by the focus/tilt detecting system 350 in the shot layout on the wafer 340 shown in FIG. 35 (step S802), and surface position measurement values Zsij(λ) are obtained for each sample shot, in-shot measuring position, and wavelength of the light used for the measurement (step S804). Here, the suffix "s" is a sample shot number and S=1 to 14. The suffix "i" is an in-shot measuring position number in a slit longitudinal direction, and i=1 to 3. The suffix "j" is an in-shot measuring position number in a scan direction, and j=1 to 7. λ is a wavelength of the illumination light, and λ=λ1 to λ3.

Figure 48:
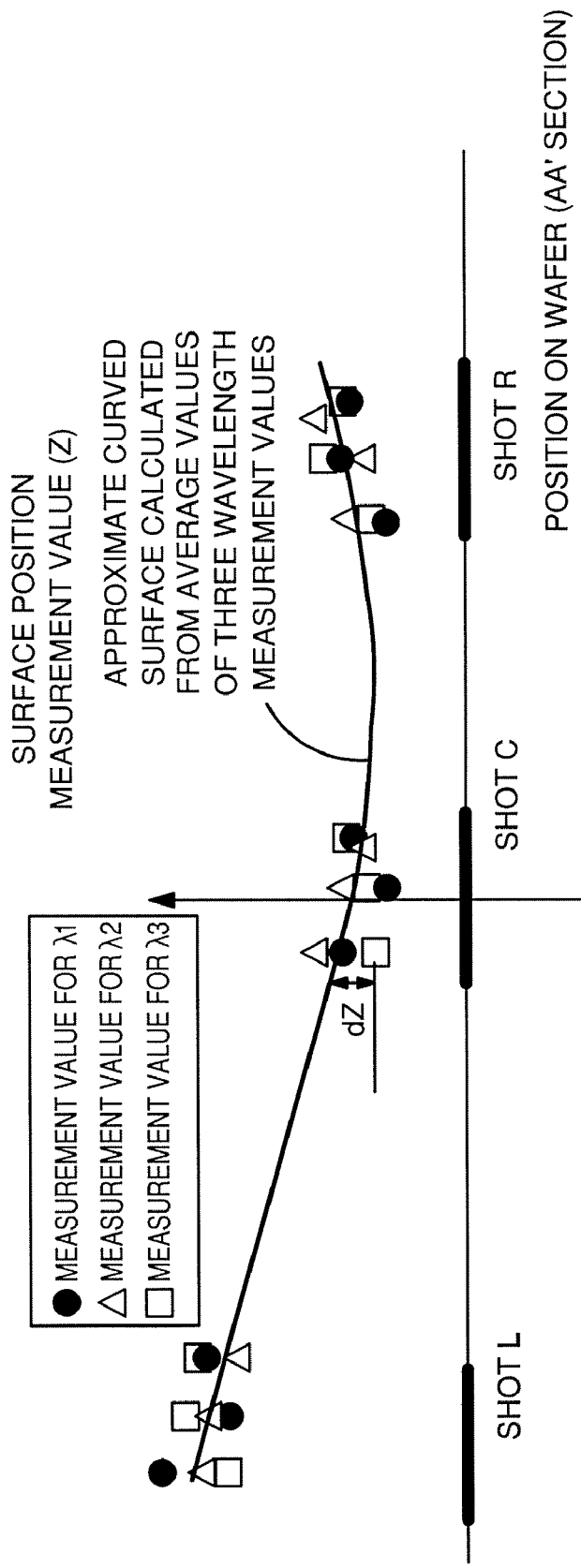
FIG. 48 shows an approximate curved surface of an A-A' surface shape on the wafer shown in FIG. 35 and a graph that plots surface position measurement values relative to sample shots for each wavelength.

Next, an average value Zasij among wavelengths of the surface position measurement values Zsij(λ) are calculated (step S806). The surface shape of the wafer 340 (or an approximate curved surface of the surface shape) is calculated using the average value Zasij and curved surface fitting (step S808). FIG. 48 shows the approximate curved surface of the A-A' surface of the wafer 340 shown in FIG. 35, and a graph that plots surface position measurement values relative to the sample shots L, D and R for each wavelength.

Next, an offset amount dzsij(λ) of the surface position measurement values Zsij(λ) from the approximate curved surface of the wafer 340 calculated by the step S808 is calculated (step S810), and a scattering amount (or standard deviation value) σdZij(λ) among sample shots is calculated for each measuring point in the shot (step S812). A wavelength that minimizes the scattering amount (or standard deviation value) σdZij (λ) is defined as the optimal wavelength λopt(i, j) (step S814) In other words, the optimal wavelength can be selected using the measurement values of the surface positions of the wafer 340 for each wavelength, instead of the feature of the signal waveform.

As discussed, in the exposure, the exposure apparatus 301 uses the focus/tilt detecting system 350, etc. to position the wafer 340's surface that is to be exposed, at the best focus surface, and can provide devices (such as a semiconductor device, an LCD device, an image pickup device (such as a CCD), and a thin-film magnetic head) with high throughput and economical efficiency.

Thus, the present invention can provide a position detecting method and apparatus and an exposure apparatus, which reduce the influence caused by the asymmetry of the alignment mark and provide highly precise position detections. In addition, the present invention provides an exposure method and apparatus, which realize a high focus accuracy relative to a small DOF, and improve the yield.

Further, the present invention is not limited to these preferred embodiments, and various variations and modifications may be made without departing from the scope of the present invention. For example, the present invention is applicable to a reticle detecting means for detecting a position of the reticle.

This application claims a foreign priority based on Japanese Patent Applications, Publication Nos. 2003-407804, filed Dec. 5, 2003, and 2004-112535, filed Apr. 6, 2004, each of which is hereby incorporated by reference herein.

What is claimed is:

1. A wavelength selecting method for selecting a wavelength of light used to detect a position of a target, said wavelength selecting method comprising the steps of:
projecting an image of a pattern that includes plural elements using plural lights having different wavelengths onto measuring positions on plural areas of the target, and detecting a signal waveform from the plural areas of the target;
obtaining plural element intervals for each of the plural wavelengths based on the signal waveform detected by said detecting step;
calculating a standard deviation of the plural element intervals at the measuring positions in the plural areas based on the plural element intervals; and
selecting one of the wavelengths that provides a smallest standard deviation among the plural standard deviations calculated by said calculating step.

2. An exposure method for exposing a pattern on a reticle onto plural shots on an object through a projection optical system, said exposure method comprising the steps of:
- detecting a position of the object in an optical-axis direction using light having a wavelength selected by a wavelength selecting method according to claim 1; and
- scanning the object in synchronization with the reticle, based on the position of the object in the optical-axis direction detected by said detecting step.

3. A wavelength selecting method for selecting a wavelength of light used to detect a position of a target, said wavelength selecting method comprising the steps of:
- projecting an image of a pattern that includes plural elements using plural lights having different wavelengths onto measuring positions on plural areas of the target, and obtaining positional information indicative of the position;
- obtaining an approximate curved surface from an average of the wavelengths of the positional information obtained in said obtaining step;
- calculating an offset amount of the positional information from the approximate curved surface; and
- selecting one of the wavelengths which one minimizes scattering among the plural areas based on the offset amounts calculated by said calculating step.

4. An exposure method for exposing a pattern on a reticle onto plural shots on an object through a projection optical system, said exposure method comprising the steps of:
- detecting a position of the reticle in an optical-axis direction using light having a wavelength selected by a wavelength selecting method according to claim 3; and
- scanning the reticle in synchronization with the object, based on the position of the reticle in the optical-axis direction detected by said detecting step.

* * * * *

UNITED STATES PATENT AND TRADEMARK OFFICE
CERTIFICATE OF CORRECTION

PATENT NO. : 7,253,885 B2
APPLICATION NO. : 11/002906
DATED : August 7, 2007
INVENTOR(S) : Takahiro Matsumoto It is certified that error appears in the above-identified patent and that said Letters Patent is hereby corrected as shown below:

ON THE TITLE PAGE:
    In item "(57) ABSTRACT," line 11, "wave" should read -- wavelength --.
    In item "(57) ABSTRACT," line 12, "provide" should read -- provides --.

COLUMN 11:
    Lines 35-40,

" [EQUATION 8]

$$V = \frac{1}{n}\sum |Ri|^2 = \frac{1}{n}\sum_{i=1}^{t=n}\left|\begin{pmatrix} xi \\ yi \end{pmatrix} - \begin{pmatrix} Bx-1 & -\theta y \\ \theta x & By-1 \end{pmatrix}\begin{pmatrix} Xi \\ Yi \end{pmatrix} - \begin{pmatrix} Sx \\ Xy \end{pmatrix}\right|^2$$

" should read

-- [EQUATION 8]

$$V = \frac{1}{n}\sum |Ri|^2 = \frac{1}{n}\sum_{i=1}^{i=n}\left|\begin{pmatrix} xi \\ yi \end{pmatrix} - \begin{pmatrix} Bx-1 & -\theta y \\ \theta x & By-1 \end{pmatrix}\begin{pmatrix} Xi \\ Yi \end{pmatrix} - \begin{pmatrix} Sx \\ Xy \end{pmatrix}\right|^2$$

--.

COLUMN 14:
    Line 20, "σin" should read -- σ in --.

COLUMN 22:
    Line 37, "3.40" should read -- 340 --.
    Line 53, "occurs" should read -- occur --.

COLUMN 24:
    Line 37, the second occurrence of "wafer" should read -- wafers --.
    Line 56, "slits the" should read -- slits. The --.

Column 25:
    Line 33, "calculated r" should read -- calculated, --.

UNITED STATES PATENT AND TRADEMARK OFFICE
CERTIFICATE OF CORRECTION

PATENT NO. : 7,253,885 B2
APPLICATION NO. : 11/002906
DATED : August 7, 2007
INVENTOR(S) : Takahiro Matsumoto It is certified that error appears in the above-identified patent and that said Letters Patent is hereby corrected as shown below:

COLUMN 26:
  Line 39, "S702)" should read -- S702). --.
  Line 48, "S704)" should read -- S704). --.

Column 28:
  Line 21 "S814)" should read -- S814). --.

Signed and Sealed this

Twenty-fourth Day of June, 2008

JON W. DUDAS
*Director of the United States Patent and Trademark Office*